US011942480B2

(12) United States Patent
Lee et al.

(10) Patent No.: US 11,942,480 B2
(45) Date of Patent: Mar. 26, 2024

(54) SEMICONDUCTOR DEVICE

(71) Applicant: SAMSUNG ELECTRONICS CO., LTD., Suwon-si (KR)

(72) Inventors: Il Min Lee, Gwangmyeong-si (KR); Hoon-Sung Choi, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 67 days.

(21) Appl. No.: 17/668,819

(22) Filed: Feb. 10, 2022

(65) Prior Publication Data

US 2022/0320142 A1   Oct. 6, 2022

(30) Foreign Application Priority Data

Mar. 31, 2021  (KR) .................. 10-2021-0041728
May 20, 2021  (KR) .................. 10-2021-0064732

(51) Int. Cl.
| | |
|---|---|
| *H01L 27/12* | (2006.01) |
| *H01L 21/84* | (2006.01) |
| *H01L 29/10* | (2006.01) |
| *H01L 29/786* | (2006.01) |
| *H01L 23/535* | (2006.01) |

(52) U.S. Cl.
CPC .......... *H01L 27/1203* (2013.01); *H01L 21/84* (2013.01); *H01L 29/1083* (2013.01); *H01L 29/78648* (2013.01); *H01L 23/535* (2013.01)

(58) Field of Classification Search
CPC . H01L 27/1203; H01L 21/84; H01L 29/1083; H01L 29/78648; H01L 29/8645

USPC .......................................... 257/348; 348/149
See application file for complete search history.

(56) References Cited

U.S. PATENT DOCUMENTS

| | | | |
|---|---|---|---|
| 7,494,850 | B2 | 2/2009 | Anderson et al. |
| 7,772,649 | B2 | 8/2010 | Cheng et al. |
| 8,030,145 | B2 | 10/2011 | Chang et al. |
| 8,227,865 | B2 | 7/2012 | Dennard et al. |
| 8,293,615 | B2 | 10/2012 | Cheng et al. |

(Continued)

OTHER PUBLICATIONS

Communication dated Sep. 27, 2022 issued by the European Patent Office in European Patent Application No. 22152703.9.

(Continued)

*Primary Examiner* — Thinh T Nguyen
(74) *Attorney, Agent, or Firm* — Sughrue Mion, PLLC

(57) ABSTRACT

A semiconductor device includes: a substrate; a first buried insulation layer disposed on the substrate; a first well which is disposed on the first buried insulation layer in a first region defined by a first element separation film, and includes a first portion extending along an upper surface of the first buried insulation layer, and a second portion extending from the first portion in a direction from the substrate toward the first buried insulation layer; a second buried insulation layer disposed on the first portion of the first well; a first semiconductor film disposed on the second buried insulation layer; a first transistor on the first semiconductor film; and a second element separation film which separates the second buried insulation layer and the first semiconductor film from the second portion of the first well, on the first portion of the first well, wherein an upper surface of the second portion of the first well is placed on the same plane as an upper surface of the first element separation film.

10 Claims, 18 Drawing Sheets

(56) References Cited

U.S. PATENT DOCUMENTS

| | | | |
|---|---|---|---|
| 8,367,490 B2 | 2/2013 | Zhu et al. | |
| 8,426,920 B2 | 4/2013 | Zhu et al. | |
| 8,587,063 B2 | 11/2013 | Dennard et al. | |
| 8,673,701 B2 | 3/2014 | Zhu et al. | |
| 9,178,070 B2 | 11/2015 | Zhu et al. | |
| 2007/0126034 A1* | 6/2007 | Sakai et al. | H01L 21/823412 257/88 |
| 2008/0203403 A1* | 8/2008 | Kawahara et al. | H01L 21/84 257/80 |

OTHER PUBLICATIONS

Communication dated Sep. 15, 2022 issued by the European Patent Office in European Patent Application No. 22152703.9.

Hatzopoulos et al., "Electrical and optical characterisation of double SIMOX structures formed by sequential high energy oxygen implantation into silicon," Elsevier, Microelectronic Engineering, vol. 28, pp. 415-418, 1995.

Hatzopoulos et al., "Double SIMOX Structures Formed by Sequential High Energy Oxygen Implantation into Silicon," Journal of The Electrochemical Society, vol. 147, No. 1, pp. 354-362, 2000.

\* cited by examiner

SEMICONDUCTOR DEVICE

CROSS-REFERENCE TO RELATED APPLICATIONS

This application is based on and claims priority from Korean Patent Application No. 10-2021-0041728 filed on Mar. 31, 2021 and No. 10-2021-0064732 field on May 20, 2021 in the Korean Intellectual Property Office, the disclosure of which is incorporated herein by reference in their entireties.

BACKGROUND

1. Field

The disclosure relates to a semiconductor device.

2. Description of the Related Art

Recent semiconductor elements have been developed in a direction in which a high speed operation is performed at a low voltage, and a manufacturing process of the semiconductor elements has been developed in a direction in which a degree of integration is improved. Therefore, patterns of a highly integrated semiconductor elements which are highly scaled may be spaced apart from each other at a fine pitch with a fine width.

During a miniaturization process of the semiconductor elements, an FD-SOI (Fully Depleted Silicon On Insulator) process in which a buried insulation layer is formed on a substrate and channels and transistors are formed on the buried insulation layer was introduced. The FD-SOI process has an effect of reducing parasitic capacitance and a leakage current by fully depleting the channels under the transistor.

SUMMARY

Various aspects of the disclosure provide a semiconductor device which includes two buried insulation layers and to which various body bias voltages may be applied.

Various aspects of the disclosure also provide a semiconductor device which includes two buried insulation layers and is easily scaled.

Other aspects of the disclosure will become more apparent to one of ordinary skill in the art to which the disclosure pertains by referencing the detailed description of the disclosure given below.

According to an aspect of the disclosure, there is provided a semiconductor device which may include: a substrate; a first buried insulation layer placed disposed on the substrate; a first well which is placed disposed on the first buried insulation layer in a first region defined by a first element separation film, and includes a first portion extending along an upper surface of the first buried insulation layer, and a second portion extending from the first portion in a direction from the substrate toward the first buried insulation layer; a second buried insulation layer placed disposed on the first portion of the first well; a first semiconductor film placed disposed on the second buried insulation layer; a first transistor on the first semiconductor film; and a second element separation film which separates the second buried insulation layer and the first semiconductor film from the second portion of the first well, on the first portion of the first well, wherein an upper surface of the second portion of the first well is placed on the same plane as an upper surface of the first element separation film.

According to an aspect of the disclosure, there is provided a semiconductor device which may include: a substrate; a first buried insulation layer placed disposed on the substrate; a first well which is placed disposed on the first buried insulation layer in a first region defined by a first element separation film, and includes a first portion extending along an upper surface of the first buried insulation layer, and a second portion extending from the first portion in a direction from the substrate toward the first buried insulation layer; a second buried insulation layer placed disposed on the first portion of the first well; a first semiconductor film placed disposed on the second buried insulation layer; a first transistor on the first semiconductor film; a second element separation film which separates the second buried insulation layer and the first semiconductor film from the second portion of the first well, on the first portion of the first well; and a first well contact placed on an upper surface of the second portion of the first well, wherein the second portion of the first well extends alongside wall of the first element separation film.

According to an aspect of the disclosure, there is provided a semiconductor device comprising: a substrate; a first buried insulation layer placed disposed on the substrate; a first well which includes a first portion having a first thickness in a first direction from the substrate toward the first buried insulation layer, and a second portion having a second thickness greater than the first thickness, on the first buried insulation layer, and extends in a second direction intersecting the first direction; a second well which includes a third portion having a third thickness in the first direction and a fourth portion having a fourth thickness greater than the third thickness, on the first buried insulation layer, and extends in the second direction; a second buried insulation layer placed disposed on the first portion of the first well; a third buried insulation layer placed disposed on the third portion of the second well; a first semiconductor film placed disposed on the second buried insulation layer; a second semiconductor film placed disposed on the third buried insulation layer; a first transistor placed disposed on the first semiconductor film; a second transistor placed disposed on the second semiconductor film; a first element separation film which completely separates the first portion of the first well, the second buried insulation layer, the first semiconductor film and the first transistor from the third portion of the second well, the third buried insulation layer, the second semiconductor film and the second transistor, respectively, on the first buried insulation layer; a second element separation film which separates the second portion of the first well from the second semiconductor film on the second buried insulation layer; a third element separation film which separates the fourth portion of the second well from the second semiconductor film on the third buried insulation layer; a first well contact placed disposed on an upper surface of the second portion of the first well; and a second well contact placed disposed on an upper surface of the fourth portion of the second well, wherein the upper surface of the second portion of the first well is placed disposed on the same plane as an upper surface of the second element separation film, and the upper surface of the fourth portion of the second well is placed disposed on the same plane as an upper surface of the third element separation film.

BRIEF DESCRIPTION OF THE DRAWINGS

The above and other aspects and features of the disclosure will become more apparent by describing in detail exemplary embodiments thereof referring to the attached drawings, in which.

DETAILED DESCRIPTION OF THE EMBODIMENTS

All of the embodiments described herein are example embodiments, and thus, the inventive concept is not limited thereto and may be realized in various other forms. It will be understood that when an element or layer is referred to as being "over," "above," "on," "below," "under," "beneath," "connected to" or "coupled to" another element or layer, it can be directly over, above, on, below, under, beneath, connected or coupled to the other element or layer or intervening elements or layers may be present. In contrast, when an element is referred to as being "directly over," "directly above," "directly on," "directly below," "directly under," "directly beneath," "directly connected to" or "directly coupled to" another element or layer, there are no intervening elements or layers present.

Figure 1:
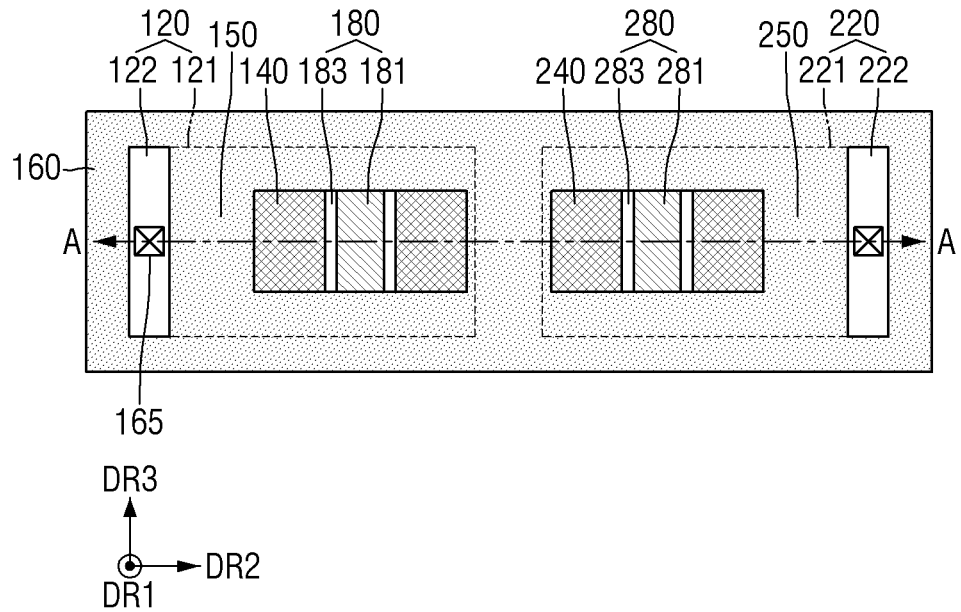
FIG. 1 is a conceptual plan view for explaining a semiconductor device, according to some embodiments.
Figure 2:
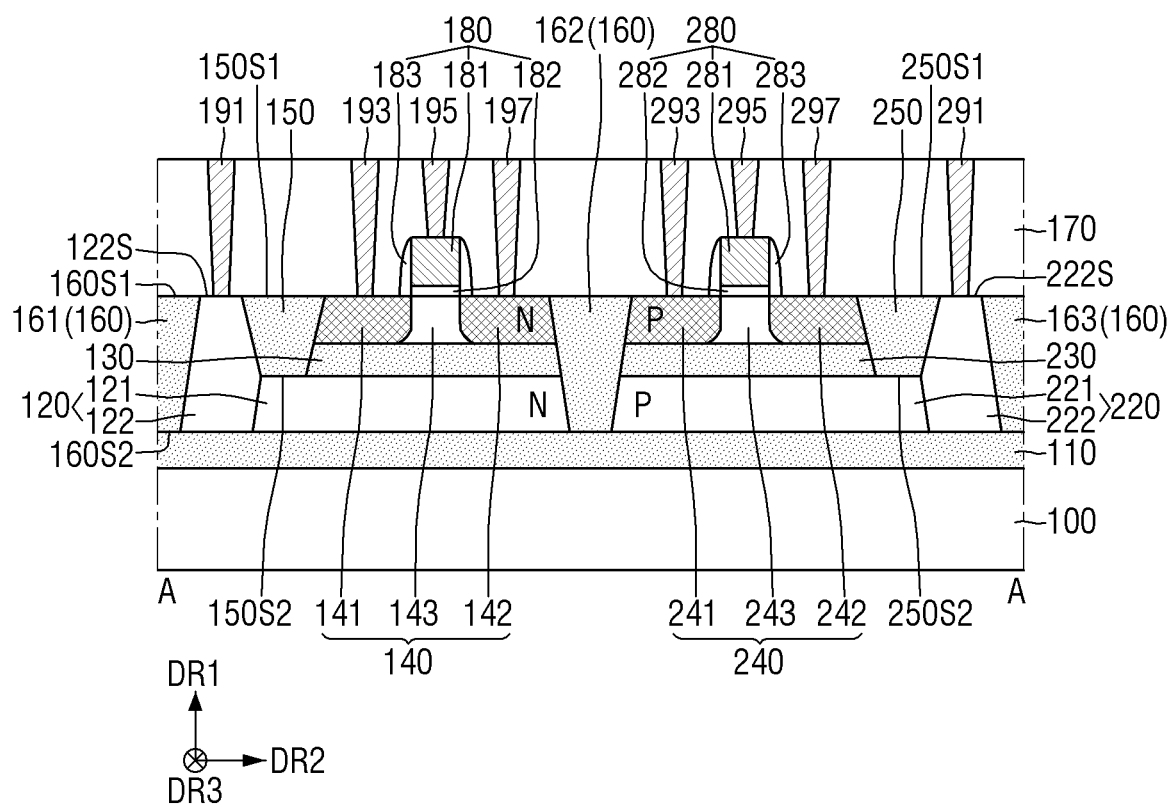
FIG. 2 is a cross-sectional view taken along A-A of FIG. 1.

FIG. 1 is a conceptual plan view for explaining a semiconductor device, according to some embodiments. FIG. 2 is a cross-sectional view taken along A-A of FIG. 1.

Referring to FIGS. 1 and 2, the semiconductor device according to some embodiments may include a substrate 100, a first buried insulation layer 110, a first well 120, a second well 220, a second buried insulation layer 130, a third buried insulation layer 230, a first semiconductor film 140, a second semiconductor film 240, a first element separation film 160, a second element separation film 150, a third element separation film 250, a first gate structure 180, a second gate structure 280, and contacts 191, 193, 195, 197, 291, 293, 295 and 297.

The substrate 100 may include, but is not limited to, a base substrate and an epitaxial layer that is grown on the base substrate. The substrate 100 may include only the base substrate without an epitaxial layer. The substrate 100 may include a silicon substrate, a silicon germanium substrate, and the like, and the silicon substrate will be described here as an example.

The first buried insulation layer 110 may be placed on the substrate 100. Although the first buried insulation layer 110 may include, for example, at least one of silicon oxide ($SiO_2$), silicon nitride (SiN), silicon oxynitride (SiON), and a combination thereof, the disclosure is not limited thereto.

The first element separation film 160 may be placed on the first buried insulation layer 110. The first element separation film 160 may extend in a first direction DR1 to come into contact with the first buried insulation layer 110. The first direction DR1 may be a direction from the substrate 100 toward the first buried insulation layer 110. As shown, although a lower surface 160S2 of the first element separation film 160 may be in contact with an upper surface of the first buried insulation layer 110, the disclosure is not limited thereto. Unlike the example shown in the drawings, the lower surface 160S2 of the first element separation film 160 may be placed inside the first buried insulation layer 110, and may also be placed substantially on the same plane as the lower surface of the first buried insulation layer 110.

The first element separation film 160 may define an active region on the first buried insulation layer 110. The first element separation film 160 may include a first element separation region 161, a second element separation region 162, and a third element separation region 163. The first element separation region 161, the second element separation region 162, and the third element separation region 163 may be spaced apart from each other in a second direction DR2. The second direction DR2 may be a direction that intersects the first direction DR1. The first element separation region 161 and the second element separation region 162 may define a first active region, and the second element separation region 162 and the third element separation region 163 may define a second active region.

The first well 120 and the second well 220 may be placed on the first buried insulation layer 110. The first well 120 may be placed in the first active region defined by the first element separation region 161 and the second element separation region 162. The second well 220 may be placed in the second active region defined by the second element separation region 162 and the third element separation region 163.

The first well 120 and the second well 220 may be completely separated by the second element separation region 162. The first well 120 and the second well 220 may not be in contact with each other. That is, the first well 120 and the second well 220 may be electrically insulated.

The first well 120 may include a first portion 121 extending along the upper surface of the first buried insulation layer 110, and a second portion 122 extending in the first direction DR1 at a side of the first portion 121. The second portion 122 may extend along one side wall of the first element separation region 161. Alternatively, the first well 120 may include the first portion 121 having a first thickness and the second portion 122 having a second thickness on the first buried insulation layer 110. The first thickness and the second thickness may be based on the first direction DR1. The second thickness may be thicker than the first thickness.

A top surface of the first well 120 may be placed substantially on the same plane as an upper surface 160S1 of the first element separation film 160 and/or an upper surface 250S1 of the third element separation film 250. The upper surface 122S of the second portion 122 of the first well 120 may be placed substantially on the same plane as the upper surface 160S1 of the first element separation film 160 and/or the upper surface 150S1 of the second element separation film 150.

The second well 220 may include a third portion 221 extending along the upper surface of the first buried insulation layer 110, and a fourth portion 222 extending in the first direction DR1 at a side of the third portion 221. The fourth portion 222 may extend along one side wall of the third element separation region 163. Alternatively, the second well 220 may include the third portion 221 having a third thickness and the fourth portion 222 having a fourth thickness on the first buried insulation layer 110. The fourth thickness may be thicker than the third thickness.

A top surface of the second well 220 may be placed substantially on the same plane as the upper surface 160S1 of the first element separation film 160 and/or the upper surface 250S1 of the third element separation film 250. An upper surface 222S of the fourth portion 222 of the second well 220 may be placed substantially on the same plane as the upper surface 160S1 of the first element separation film 160 and/or the upper surface 250S1 of the third element separation film 250.

The first well 120 and the second well 220 may have different conductive types from each other. The first well 120 may have a first conductive type and the second well 220 may have a second conductive type. The first well 120 may be, for example, an N type, and the second well 220 may be a P type.

The first well 120 may function as a body region of a first transistor, and the second well 220 may function as a body region of a second transistor.

A first well contact 191 may be placed on the upper surface 122S of the second portion 122 of the first well 120. A lower surface of the first well contact 191 may be in contact with the upper surface 122S of the second portion 122 of the first well 120. The first well contact 191 may be electrically connected to the first well 120. A body bias voltage may be applied to the first well 120 through the first well contact 191.

A second well contact 291 may be placed on the upper surface 222S of the fourth portion 222 of the second well 220. A lower surface of the second well contact 291 may be in contact with the upper surface 222S of the fourth portion 222 of the second well 220. The second well contact 291 may be electrically connected to the second well 220. A body bias voltage may be applied to the second well 220 through the second well contact 291. Therefore, a threshold voltage, a saturation current, and a leakage current of the semiconductor device according to some embodiments may be controlled.

The first well contact 191 and the second well contact 291 may include a conductive substance. Although the conductive substance may include, for example, at least one of polycrystalline silicon, a metal silicide compound, a conductive metal nitride, and a metal, the disclosure is not limited thereto.

Unlike the shown example, a silicide film may be formed between the lower surface of the first well contact 191 and the upper surface 122S of the second portion 122 of the first well 120 and/or between the lower surface of the second well contact 291 and the upper surface 222S of the fourth portion 222 of the second well 220. Accordingly, the resistance between the first well contact 191 and the first well 120 and/or between the second well contact 291 and the second well 220 may be reduced.

In the semiconductor device according to some embodiments, because the first well 120 and the second well 220 are completely separated by the first element separation film 160, no PN junction is formed between the first well 120 and the second well 220. Therefore, not only a forward body bias (FBB) voltage but also a reverse body bias (RBB) voltage may be applied to the first well 120 through the first well contact 191. The forward body bias voltage as well as the reverse body bias voltage may be applied to the second well 290 through the second well contact 192. That is, the body bias voltage applied to the first well 120 is not limited by the body bias voltage applied to the second well 220. The first well 120 and the second well 220 are not limited by one of the forward body bias voltage and the reverse body bias voltage, respectively. The body bias voltage applied to the first well 120 and the second well 220 may be applied freely within a range that does not cause an HCI (Hot Carrier Injection) phenomenon on the second element separation region 162 or does not become equal to or higher than a breakdown voltage.

Accordingly, the semiconductor device according to some embodiments may have various threshold voltages depending on the body bias voltage, and the scaling of the semiconductor device may become easier.

The second buried insulation layer 130 may be placed on the first portion 121 of the first well 120. The first well 120 may be insulated from the first semiconductor film 140 by the second buried insulation layer 130. The third buried insulation layer 230 may be placed on the third portion 221 of the second well 220. The second well 220 may be insulated from the second semiconductor film 240 by the third buried insulation layer 230.

The second buried insulation layer 130 and the third buried insulation layer 230 may be separated by the second element separation region 162. That is, the substrate 100 may be a silicon substrate including two insulation layers.

Although the second buried insulation layer 130 and the third buried insulation layer 230 may include, for example, silicon oxide ($SiO_2$), silicon nitride (SiN), silicon oxynitride (SiON), and a combination thereof, the disclosure is not limited thereto The first semiconductor film 140 may be placed on the second buried insulation layer 130. The first semiconductor film 140 may include a first source region 141, a first drain region 142, and a first channel region 143. The first source region 141 and the first drain region 142 may function as a source and a drain of the first gate structure 180, respectively.

The second semiconductor film 240 may be placed on the third buried insulation layer 230. The second semiconductor film 240 may include a second source region 241, a second drain region 242, and a second channel region 243. The second source region 241 and the second drain region 242 may function as a source and a drain of the second gate structure 280, respectively. The first semiconductor film 140 and the second semiconductor film 240 may be separated by the second element separation region 162.

Unlike the example shown in the drawings, at least a part of the first source region 141 and the first drain region 142 may have a structure that protrudes from the upper surface of the first semiconductor film 140, and at least a part of the second source region 241 and the second drain region 242 may have a structure that protrudes from the upper surface of the second semiconductor film 240.

The first semiconductor film 140 and the second semiconductor film 240 may have different conductive types from each other. The first semiconductor film 140 may have the same conductive type as the first well 120, and the second semiconductor film 240 may have the same conductive type as the second well 220. The first semiconductor film 140 may have a first conductive type, and the second semiconductor film 240 may have a second conductive type.

The first semiconductor film 140 may be, for example, an N type, and the second semiconductor film 240 may be a P type.

A first source contact 193 and a second source contact 293 may be formed on the first source region 141 and the second source region 241, respectively. A source voltage may be applied to each of the first source region 141 and the second source region 241 through the first source contact 193 and the second source contact 293. A first drain contact 197 and a second drain contact 297 may be formed on the first drain region 142 and the second drain region 242, respectively. A drain voltage may be applied to the first drain region 142 and the second drain region 292 through the first drain contact 197 and the second drain contact 297, respectively.

The first source contact 193, the second source contact 293, the first drain contact 197, and the second drain contact 297 may include a conductive substance. For example, although such a conductive substance may include at least one of polycrystalline silicon, metal silicide compound, conductive metal nitride, and metal, the disclosure is not limited thereto.

The second element separation film 150 may be placed between the first element separation region 161 and the second element separation region 162. The second element separation film 150 may be placed on the first well 120. The second element separation film 150 may extend in the first direction DR1 and come into contact with the second buried insulation layer 130. A lower surface 150S2 of the second element separation film 150 may be placed substantially on the same plane as the lower surface of the second buried insulation layer 130.

The second element separation film 150 may separate the second portion 122 of the first well 120 and the second buried insulation layer 130, and the second portion 122 of the first well 120 and the first semiconductor film 140. That is, the second portion 122 of the first well 120 may extend along one side wall of the second element separation film 150. The second portion 122 of the first well 120 may fill between the first element separation region 161 and the second element separation film 150. Therefore, in the semiconductor device according to some embodiments, the first well 120 may be insulated. The first well 120 may be in contact with the first buried insulation layer 110, the first element separation region 161, the first element separation film 150, the second buried insulation layer 130, and the second element separation region 162. The first well 120 may be insulated by the first buried insulation layer 110, the first element separation region 161, the first element separation film 150, the second buried insulation layer 130, and the second element separation region 162.

The third element separation film 250 may be placed between the second element separation region 162 and the third element separation region 163. The third element separation film 250 may be placed on the second well 220. The third element separation film 250 may extend in the first direction DR1 and come into contact with the third buried insulation layer 230. A lower surface 250S2 of the third element separation film 250 may be placed substantially on the same plane as the lower surface of the third buried insulation layer 230.

The third element separation film 250 may separate the fourth portion 222 of the second well 220 and the third buried insulation layer 230, and the fourth portion 222 of the second well 220 and the second semiconductor film 240. That is, the fourth portion 222 of the second well 220 may extend along one side wall of the third element separation film 250. The fourth portion 222 of the second well 220 may fill between the third element separation film 250 and the third element separation region 163. Therefore, in the semiconductor device according to some embodiments, the second well 220 may be insulated. The second well 220 may be in contact with the first buried insulation layer 110, the second element separation region 162, the third buried insulation layer 230, the third element separation film 250, and the third element separation region 163. The second well 220 may be insulated by the first buried insulation layer 110, the second element separation region 162, the third buried insulation layer 230, the third element separation film 250, and the third element separation region 163.

Unlike the shown example, the lower surface 150S2 of the second element separation film 150 and the lower surface 250S2 of the third element separation film 250 may be placed substantially on the same plane as the upper surface of the second buried insulation layer 130 and the upper surface of the third buried insulation layer 230, or may be placed inside the second buried insulation layer 130 and the third buried insulation layer 230, respectively.

The lower surface 150S2 of the second element separation film 150 and the lower surface 250S2 of the third element separation film 250 may be placed above a level of the lower surface 160S2 of the first element separation film 160.

The first gate structure 180 may be placed on the first semiconductor film 140. The first gate structure 180 may include a first gate electrode 181, a first gate insulation layer 182 and a first gate spacer 183. The second gate structure 280 may be placed on the second semiconductor film 240. The second gate structure 280 may include a second gate electrode 281, a second gate insulation layer 282, and a second gate spacer 283.

The first gate structure 180 and the first semiconductor film 140 may form the first transistor, and the second gate structure 280 and the second semiconductor film 240 may form the second transistor.

The first gate electrode 181 may be formed to fill a gate trench defined by the first gate spacer 183 and the first gate insulation layer 182. The second gate electrode 281 may be formed to fill a gate trench defined by the second gate spacer 283 and the second gate insulation layer 282. The first gate electrode 181 and the second gate electrode 281 may include a conductive substance.

For example, the first gate electrode 181 and the second gate electrode 281 may include at least one of polysilicon (poly Si), amorphous silicon (a-Si), tantalum (Ti), titanium nitride (TiN), tungsten nitride (WN), titanium aluminum (TiAl), titanium aluminum nitride (TiAlN), tantalum nitride (TaN), titanium carbide (TiC), tantalum carbide (TaC), tantalum carbonitride (TaCN), tantalum silicon nitride (TaSiN), tantalum (Ta), cobalt (Co), ruthenium (Ru), aluminum (Al), tungsten (W) and combinations thereof. The first gate electrode 181 may be formed through, but is not limited to, for example, a replacement process (or a gate last process). The first gate electrode 181 may also be formed through a gate first process.

A first gate contact 195 may be formed on the first gate electrode 181. A gate voltage may be applied to the first gate electrode 181 through the first gate contact 195. The second gate contact 295 may be formed on the second gate electrode 281. A gate voltage may be applied to the second gate electrode 281 through the second gate contact 295.

The first gate contact 195 and the second gate contact 295 may include a conductive substance. For example, although the conductive substance may include at least one of polycrystalline silicon, metal silicide compound, conductive metal nitride, and metal, the disclosure is not limited thereto.

The first gate insulation layer 182 may be formed between the first gate electrode 181 and the first semiconductor film 140. The first gate insulation layer 182 may be formed on the first channel region 143 of the first semiconductor film 140. The second gate insulation layer 282 may be formed between the second gate electrode 281 and the second semiconductor film 240. The second gate insulation layer 282 may be formed on the second channel region 243 of the second semiconductor film 240. That is, since the semiconductor device according to some embodiments has an FD-SOI (Fully Depleted Silicon On Insulator) structure, the first channel region 143 and the second channel region 243 may be completely depleted, and a parasitic capacitance and a leakage current may be reduced accordingly.

The first gate insulation layer 182 and the second gate insulation layer 282 may include silicon oxide ($SiO_2$), silicon oxynitride (SiON), silicon nitride (SiN), and a high dielectric constant (high-k) material having a higher dielectric constant than silicon oxide. The high dielectric constant material may include, but is not limited to, for example, one or more of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide or lead zinc niobate.

The first gate spacer 183 may be formed on the side walls of the first gate electrode 181. The second gate spacer 283 may be formed on the side walls of the second gate electrode 281. The first gate spacer 183 and the second gate spacer 283 may include, for example, at least one of silicon nitride (SiN), silicon oxynitride (SiON), silicon oxide ($SiO_2$), silicon oxycarbonitride (SiOCN), and combinations thereof.

Also, unlike the shown example, an interface film may be interposed between the first gate insulation layer 182 and the first channel region 143 and/or between the second gate insulation layer 282 and the second channel region 243.

The interlayer insulation layer 170 may cover the first element separation film 160, the second element separation film 150, the third element separation film 250, the first gate structure 180, the second gate structure 280, the first semiconductor film 140, and the second semiconductor film 240. The contacts 191, 193, 195, 197, 291, 293, 295 and 297 may be formed inside the interlayer insulation layer 170. Although the interlayer insulation layer 170 may include, for example, an oxide film, the disclosure is not limited thereto.

FIGS. 3 to 8 are cross-sectional views for explaining a semiconductor device according to some embodiments. For reference, FIGS. 3 to 8 may be cross-sectional views taken along A-A of FIG. 1. For convenience of explanation, points different from FIG. 2 will be mainly described.

Figure 3:
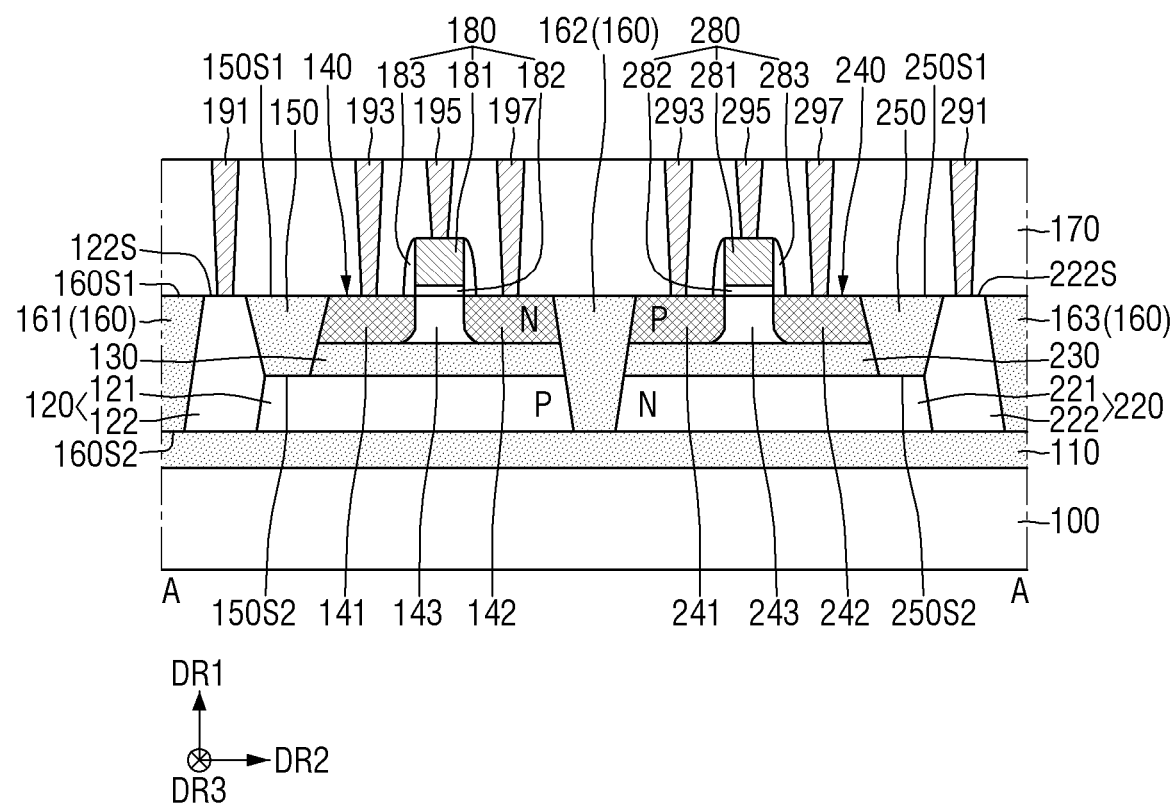
FIGS. 3 to 8 are cross-sectional views for explaining a semiconductor device, according to some embodiments.

Referring to FIG. 3, in the semiconductor device according to some embodiments, the first semiconductor film 140 may have a conductive type different from the first well 120, and the second semiconductor film 240 may have a conductive type different from the second well 220. The first well 120 may have a second conductive type and the second well 220 may have a first conductive type. The first well 120 may be, for example, a P type, and the second well 220 may be, for example, an N type.

Figure 4:
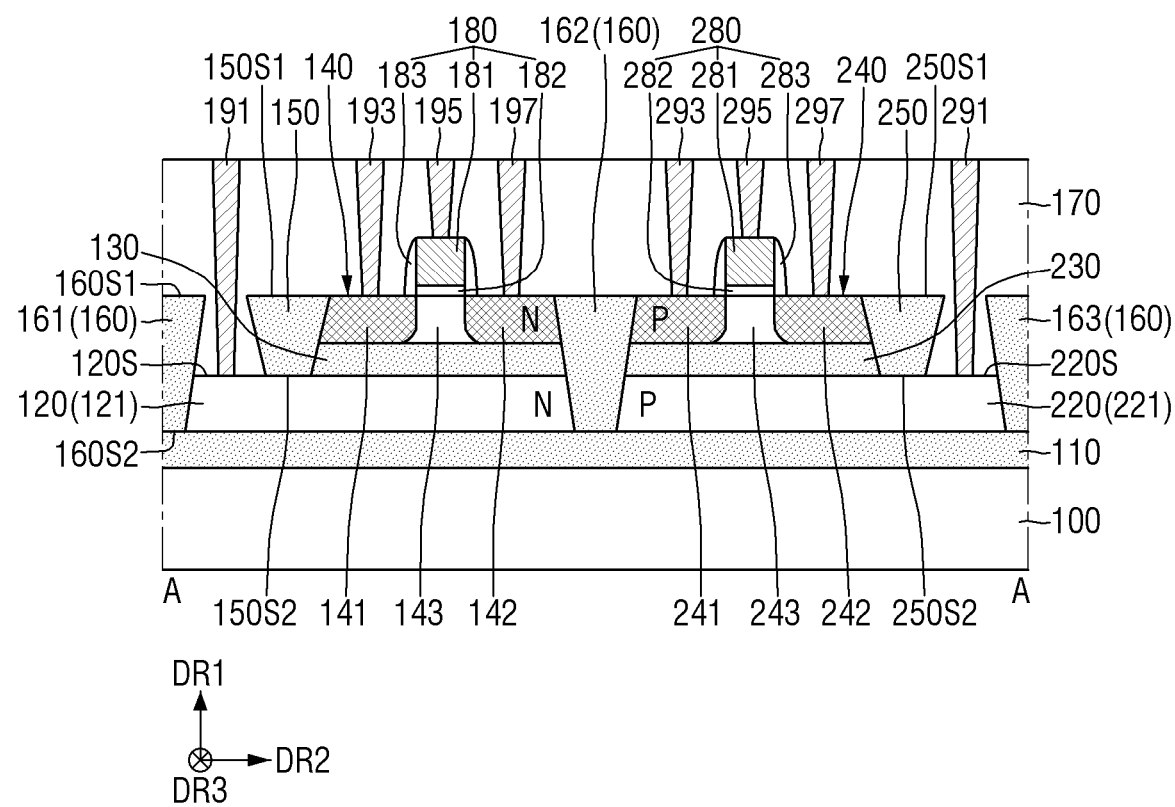

Referring to FIG. 4, in the semiconductor device according to some embodiments, a top surface 120S of the first well 120 may be placed below a level of the upper surface 160S1 of the first element separation film 160 and a level of the upper surface 150S1 of the second element separation film 150. The top surface 120S of the first well 120 may be exposed by the first element separation region 161 and the second element separation film 150. That is, the first well 120 may not include the second portion 122 of FIG. 2.

A top surface 220S of the second well 220 may be placed below a level of the upper surface 250S1 of the third element separation film 250 and a level of the upper surface 160S1 of the first element separation film 160. The top surface 220S of the second well 220 may be exposed by the third element separation film 250 and the third element separation region 163. That is, the second well 220 may not include the fourth portion 222 of FIG. 2.

Figure 5:
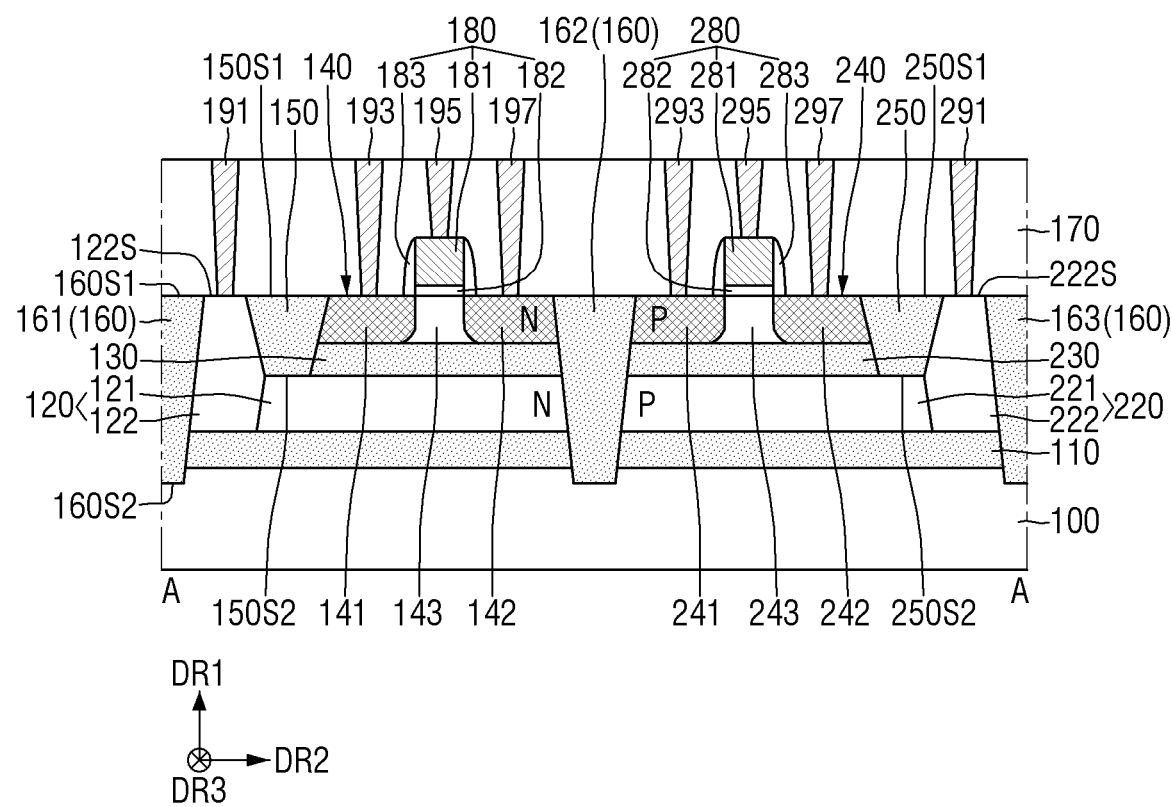

Referring to FIG. 5, the first element separation film 160 may penetrate the first buried insulation layer 110. The first element separation film 160 may extend into the substrate 100. The lower surface 160S2 of the first element separation film 160 may be placed inside the substrate 100.

Figure 6:
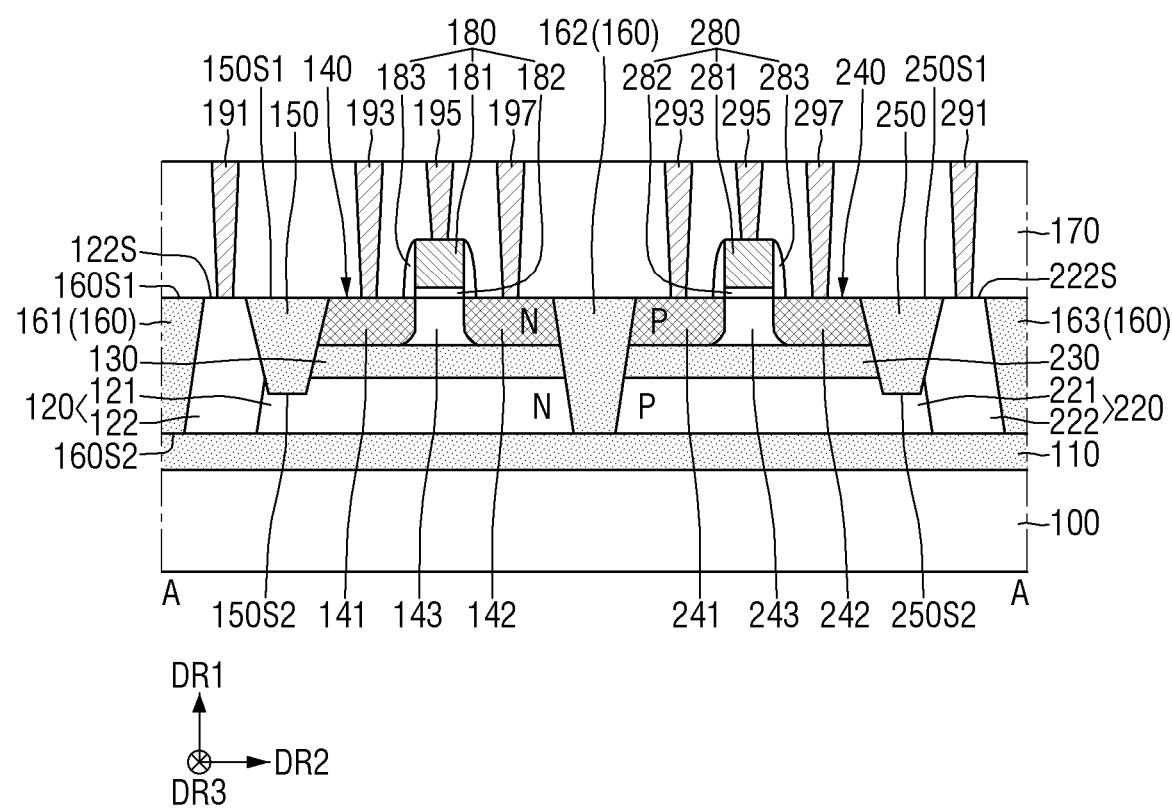

Referring to FIG. 6, the second element separation film 150 may penetrate the second buried insulation layer 130. The second element separation film 150 may extend into the first well 120. The lower surface 150S2 of the second element separation film 150 may be placed inside the first portion 121 of the first well 120.

The third element separation film 250 may penetrate the third buried insulation layer 230. The third element separation film 250 may extend into the second well 220. The lower surface 250S2 of the third element separation film 250 may be placed inside the fourth portion 222 of the second well 220.

Figure 7:
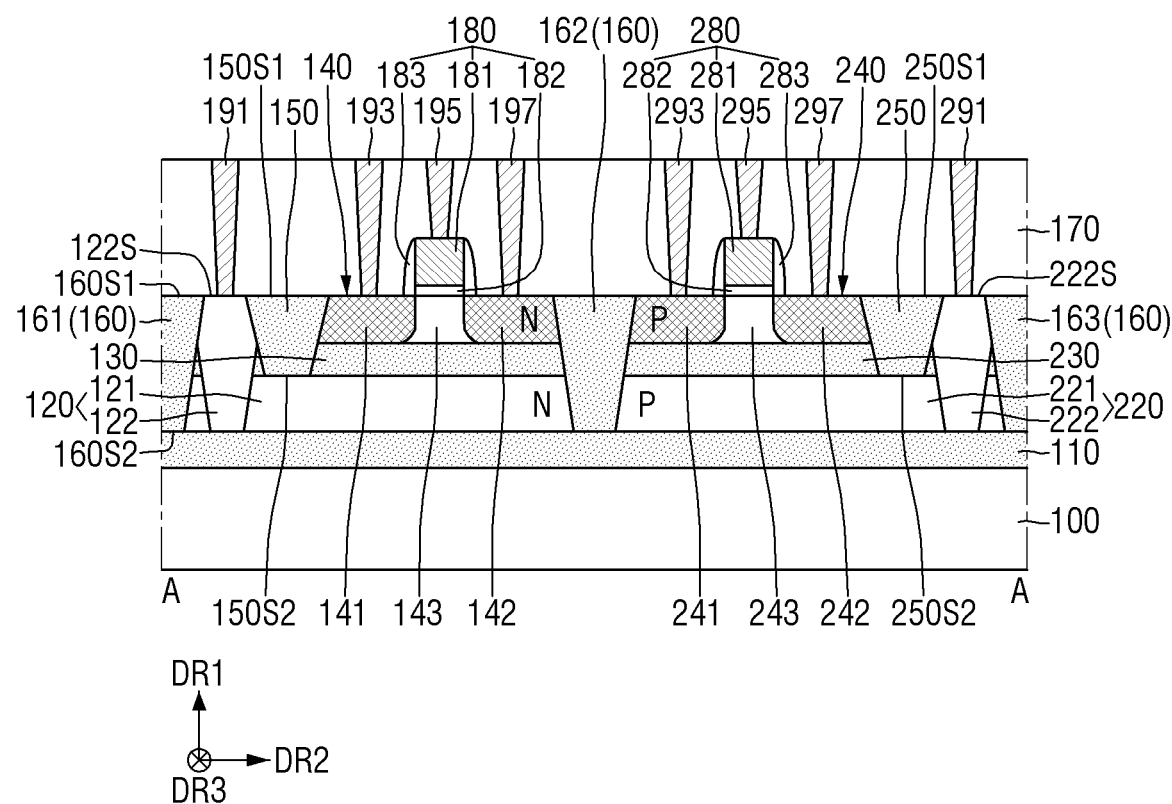

Referring to FIG. 7, the second portion 122 of the first well 120 may penetrate the second buried insulation layer 130. At least a part of the side wall of the second portion 122 of the first well 120 may be in contact with the second buried insulation layer 130.

The fourth portion 222 of the second well 220 may penetrate the third buried insulation layer 230. At least a part of the side wall of the fourth portion 222 of the second well 220 may be in contact with the third buried insulation layer 230. This may be attributed to a position at which the first element separation film 160, the second element separation film 150 and the third element separation film 250 are formed and/or a position at which the second portion 122 of the first well and the fourth portion 222 of the second well 220 are formed.

Figure 8:
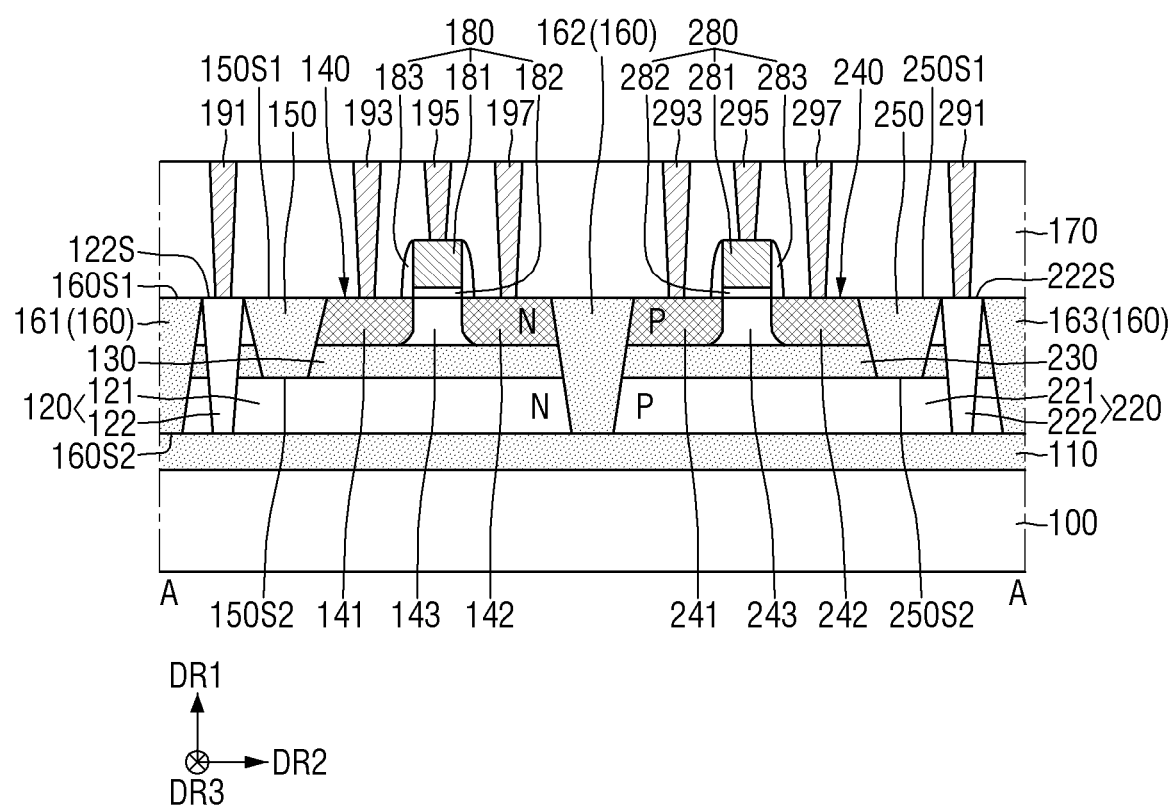

Referring to FIG. 8, in some embodiments, the second portion 122 of the first well 120 may penetrate the second buried insulation layer 130 and the first semiconductor film 140. At least a part of the side wall of the second portion 122 of the first well 120 may be in contact with the second buried insulation layer 130 and the first semiconductor film 140.

The fourth portion 222 of the second well 220 may penetrate the third buried insulation layer 230 and the second semiconductor film 240. At least a part of the side wall of the fourth portion 222 of the second well 220 may be in contact with the third buried insulation layer 230 and the second semiconductor film 240. This may be attributed to a position at which the first element separation film 160, the second element separation film 150 and the third element separation film 250 are formed and/or a position at which the second portion 122 of the first well and the fourth portion 222 of the second well 220 are formed.

Figure 9:
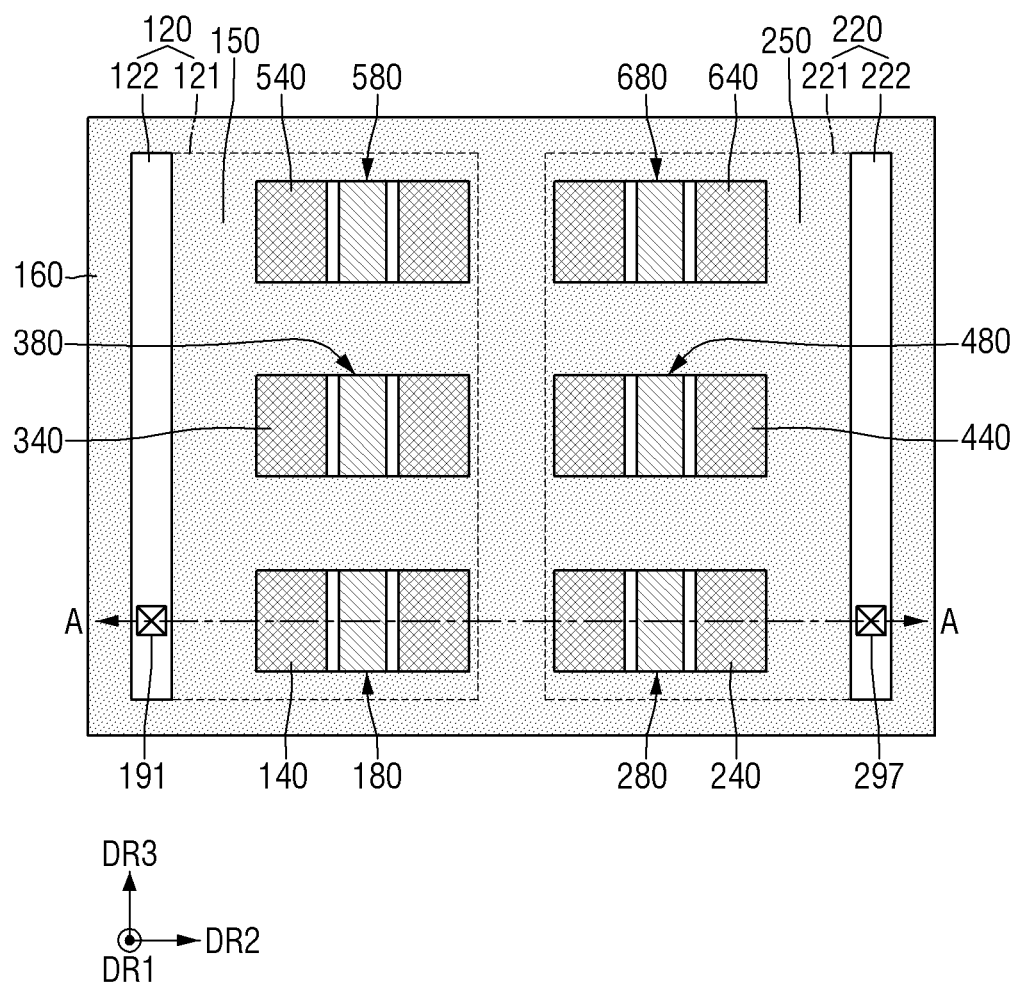
FIG. 9 is a conceptual plan view for explaining a semiconductor device, according to some embodiments.

FIG. 9 is a conceptual plan view for explaining a semiconductor device, according to some embodiments. For convenience of explanation, points different from those of FIG. 1 will be mainly described. For reference, FIGS. 2 to 8 are cross-sectional views taken along A-A of FIG. 9.

Referring to FIG. 9, a semiconductor device according to some embodiments may include a plurality of gate structures 180, 280, 380, 480, 580 and 680. The first, third and fifth gate structures 180, 380 and 580 may be placed on the first well 120, and the second, fourth and sixth gate structures 280, 480 and 680 may be placed on the second well 220.

The first element separation film 160 may define the first well 120 and the second well 220. The first well 120 and the second well 220 may be separated by the first element separation film 160. The first well 120 and the second well 220 may extend in the third direction DR3.

The second element separation film 150 may be placed on the first portion 121 of the first well 120. The second element separation film 150 may define the first, third and fifth gate structures 180, 380 and 580. The first, third and fifth gate structures 180, 380 and 580 may be placed on the first portion 121 of the first well 120. The first, third and fifth gate structures 180, 380 and 580 may be separated by the second element separation film 150.

The first, third and fifth gate structures 180, 380 and 580 may share the first well 120 and the first well contact 191. The first, third and fifth gate structures 180, 380 and 580 may share the first well 120 as a common body region. When a body bias voltage is applied to the first well 120 through the first well contact 191, the first, third and fifth gate structures 180, 380 and 580 have may have a common body bias. That is, the first, third and fifth transistors configured by the first, third and fifth gate structures 180, 380 and 580 may have the same threshold voltage.

The third element separation film 250 may be placed on the third portion 221 of the second well 220. The third element separation film 250 may define the second, fourth and sixth gate structures 280, 480 and 680. The second, fourth and sixth gate structures 280, 480 and 680 may be placed on the third portion 221 of the second well 220. The second, fourth and sixth gate structures 280, 480 and 680 may be separated by the third element separation film 250.

The second, fourth and sixth gate structures 280, 480 and 680 may share the second well 220 and the second well contact 291. The second, fourth and sixth gate structures 280, 480 and 680 may share the second well 220 as a common body region. When a body bias voltage is applied to the second well 220 through the second well contact 291, the second, fourth and sixth gate structures 280, 480 and 680 may have a common body bias. That is, the second, fourth and sixth transistors configured by the second, fourth and sixth gate structures 280, 480 and 680 may have the same threshold voltage.

Therefore, in the semiconductor device according to some embodiments, transistors having the same threshold voltage may be placed on the single well to share the well as a common body region, and the body bias voltage may be applied to the transistors through the single well contact. Therefore, the area of the semiconductor device according to some embodiments may decrease compared to the semiconductor device in which a well contact is formed for each transistor.

Figure 10:
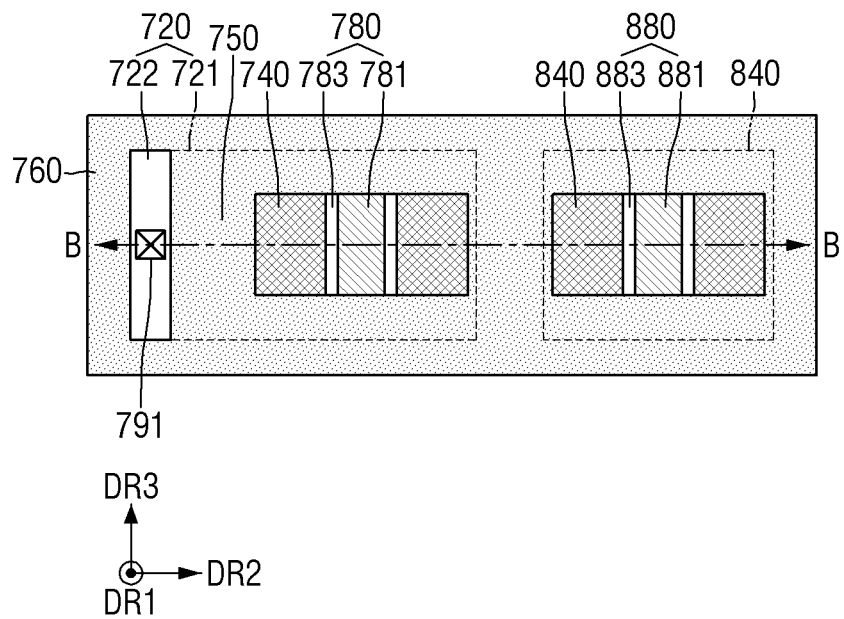
FIG. 10 is a conceptual plan view for explaining a semiconductor device, according to some embodiments.
Figure 11:
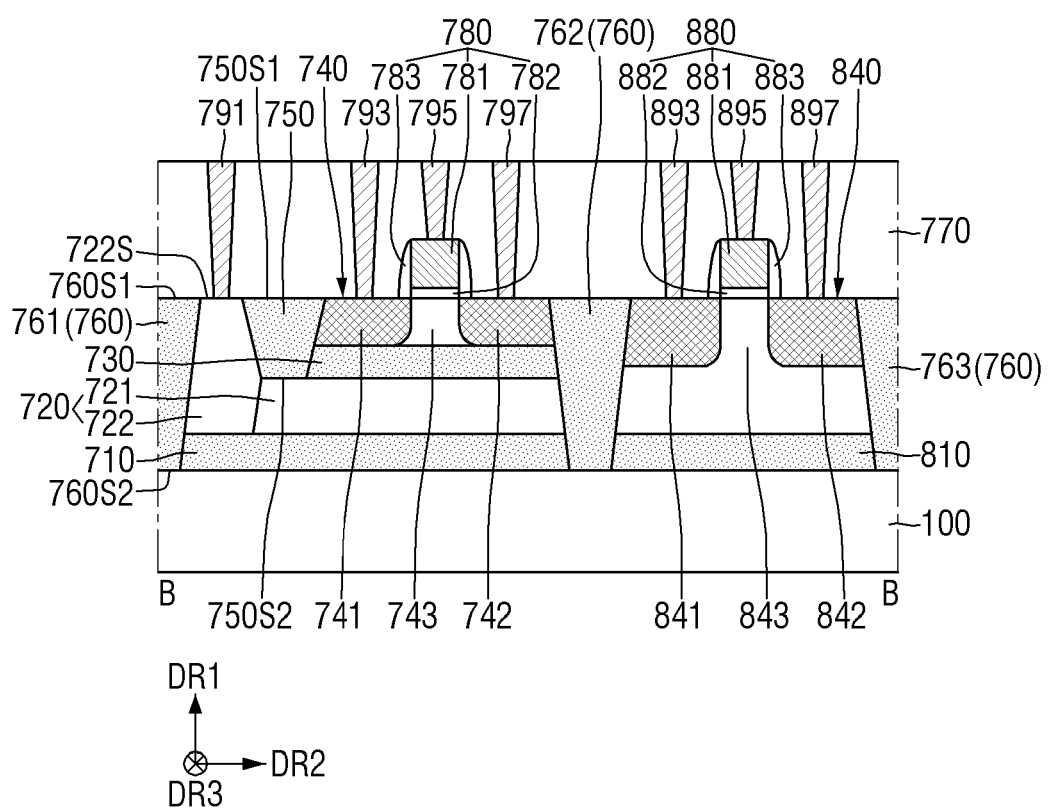
FIG. 11 is a cross-sectional view taken along B-B of FIG. 10.

FIG. 10 is a conceptual plan view for explaining a semiconductor device, according to some embodiments. FIG. 11 is a cross-sectional view taken along the line B-B of FIG. 10. For convenience of explanation, points different from those of FIGS. 1 and 2 will be mainly described.

Referring to FIGS. 10 and 11, the semiconductor device according to some embodiments may include a substrate 100, a first buried insulation layer 710, a first well 720, a third buried insulation layer 730, a first semiconductor film 740, a first element separation film 760, a second element separation film 750, a first gate structure 780, a second buried insulation layer 810, a second well 820, a second semiconductor film 840, a second gate structure 880, and contacts 791, 793, 795, 797, 893, 895 and 897.

The first buried insulation layer 710, the first well 720, the third buried insulation layer 730, the first semiconductor film 740, the first element separation film 760, the second element separation film 750, the interlayer insulation layer 770, the first gate structure 780, the first well contact 791, the first source contact 793, the first gate contact 795, and the first drain contact 797 may be substantially the same as each of the first buried insulation layer 110, the first well 120, the second buried insulation layer 130, the first semiconductor film 140, the first element separation film 160, the second element separation film 150, the interlayer insulation film 170, the first gate structure 180, the first well contact 191, the first source contact 193, the first gate contact 195 and the first drain contact 197 shown in FIGS. 1 and 2.

The second buried insulation layer 810 and the second semiconductor film 840 may be sequentially placed on the substrate 100. The second buried insulation layer 810 and the second semiconductor film 840 are placed in the second active region defined by the second element separation region 762 and the third element separation region 763. The second buried insulation layer 810 and the second semiconductor film 840 may be separated from the first buried insulation layer 710, the first well 720, the third buried insulation layer 730 and the first semiconductor film 740, by the second element separation region 762.

The first element separation film 760 may be in contact with the substrate 100. A bottom surface 760S2 of the first element separation film 760 may be placed substantially on the same plane as an upper surface of the substrate 100. Unlike the shown example, the bottom surface 760S2 of the first element separation film 760 may also be placed inside the substrate 100. A lower surface 750S2 of the second element separation film 750 may be placed substantially on the same plane as the top surface of the third buried insulation layer 730, and may also be placed inside the third buried insulation layer 730.

The lower surface 750S2 of the second element separation film 750 may be placed above a level of the lower surface 760S2 of the first element separation film 760.

The second semiconductor film 840 may include a second source region 841, a second drain region 842 and a second channel region 843. The second source region 841 and the second drain region 842 may function as a source and a drain of the second gate structure 880, respectively. A source voltage may be applied to the second source region 841 through the second source contact 893. A drain voltage may be applied to the second drain region 842 through the second drain contact 897.

Bottom surfaces of the second source region 841 and the second drain region 842 may be, for example, placed below a level of the bottom surfaces of the first source region 141 and the first drain region 142.

The second gate structure 880 may be placed on the second semiconductor film 840. The second gate structure 880 may include a second gate electrode 881, a second gate insulation layer 882 and a second gate spacer 883. The second gate structure 880 may form a second transistor.

The second gate electrode 881 may be formed to fill a gate trench defined by the second gate spacer 883 and the second gate insulation layer 882. The second gate electrode 881 and the second gate contact 895 may include a conductive substance. A gate voltage may be applied to the second gate electrode 881 through the second gate contact 895. The second gate insulation layer 882 may be formed between the second gate electrode 881 and the second semiconductor film 840. The second gate insulation layer 882 may be formed on the second channel region 843 of the second semiconductor film 840. The second gate spacer 883 may be formed on the side wall of the second gate electrode 281. An interface film is interposed between the first gate insulation layer 782 and the first channel region 743 and/or between the second gate insulation layer 882 and the second channel region 843.

The first gate structure 780 and the first semiconductor film 740 may form the first transistor, and the second gate structure 880 and the second semiconductor film 840 may form the second transistor. That is, the semiconductor device according to some embodiments may include a first transistor having an FD-SOI (Fully Depleted Silicon On Insulator) structure, and a second transistor having a PD-SOI (Partially Depleted Silicon On Insulator) structure. The first transistor and the second transistor are electrically insulated by the first element separation film 760 and may operate independently of each other.

According to an embodiment, the semiconductor device shown in FIG. 10 may be extended to the third direction DR3 to take a form similar to the semiconductor device shown in FIG. 9, thereby including two additional first semiconductor films 740 and two additional first gate structures 780 in the third direction DR3, and two additional second semiconductor films 840 and two additional second gate structures 880 in the third direction DR3. In this embodiment, the bottom surfaces of the second source region 841 and the second drain region 842 in any of the second semiconductor film 840 may be disposed below a level of the bottom surfaces of the first source region 741 and the first drain region 742 in any of the first semiconductor film 740.

FIGS. 12 to 17 are intermediate stage diagrams for explaining a method of manufacturing a semiconductor device in reference to FIGS. 1 and 2, according to some embodiments. For reference, FIGS. 12 to 17 are cross-sectional views taken along A-A of FIG. 17. The reference numbers used in FIGS. 1 and 2 apply to the description of the method shown in FIGS. 12 to 17.

Figure 12:
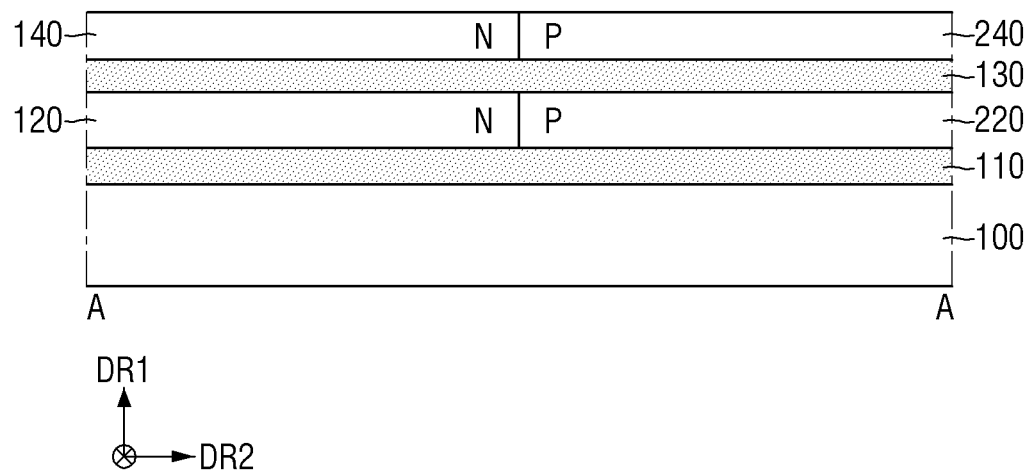
FIGS. 12 to 17 are intermediate stage diagrams for explaining a method of manufacturing a semiconductor device in reference to FIGS. 1 and 2, according to some embodiments.

Referring to FIG. 12, the substrate 100 on which the first buried insulation layer 110, the first well 120, the second well 220, the second buried insulation layer 130, the first semiconductor film 140 and the second semiconductor film 240 are each formed may be provided. Each of the first well 120 and the second well 220 may be a first portion 121 of the first well 120 and a third portion 221 of the second well 220, which will be described later.

The first well 120, the second well 220, the first semiconductor film 140, and the second semiconductor film 240 may be formed by doping the substrate 100 with impurities, respectively. For example, the substrate 100 may be doped with a substance of the first conductive type and a substance of the second conductive type to form each of the first well 120 and the second well 220. Further, the substrate 100 may be doped with the substance of the first conductive type and the substance of the second conductive type to form each of the first semiconductor film 140 and the second semiconductor film 240.

Figure 13:
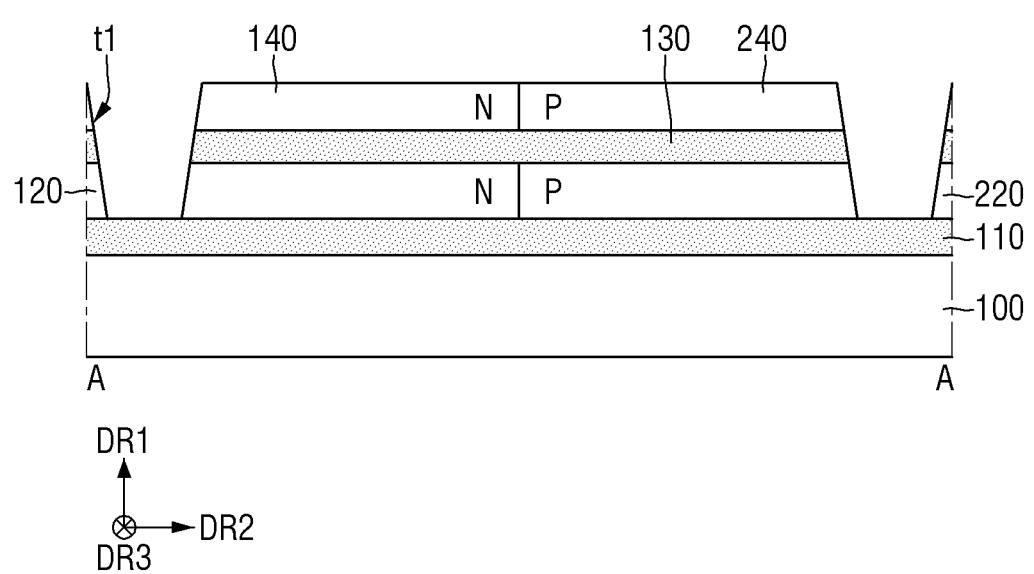

Referring to FIG. 13, a first trench t1 may be formed. The first trench t1 may penetrate the first semiconductor film 140, the second buried insulation layer 130 and the first well 120. The first trench t1 may penetrate the second semiconductor film 240, the second buried insulation layer 130 and the second well 220. An upper surface of the first buried insulation layer 110 may be exposed by the first trench t1.

Alternatively, the first trench t1 may etch the first semiconductor film 140 and the second buried insulation layer 130, and the second semiconductor film 240 and the third buried insulation layer 230 to expose the upper surface of the well 120 and the upper surface of the second well 220. Alternatively, the first trench t1 may be formed such that a bottom surface is placed inside the first well 120 and the second well 220.

Figure 14:
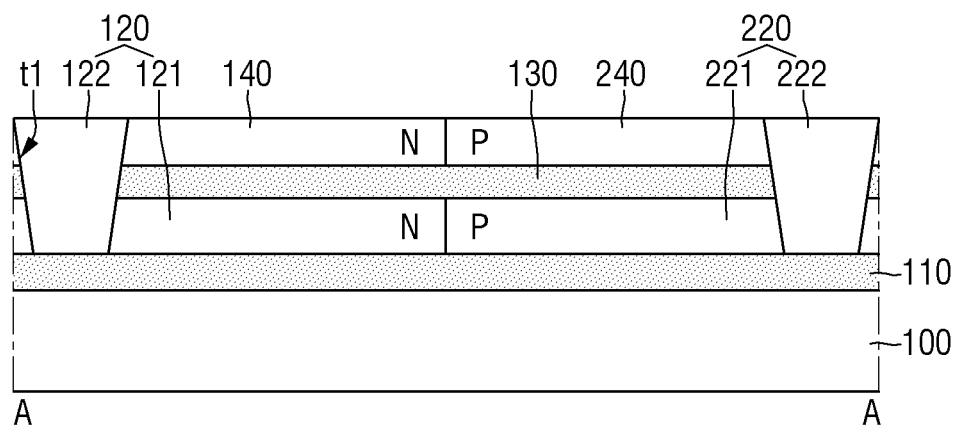
Figure 14:
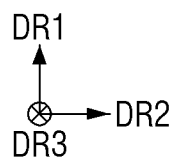

Referring to FIG. 14, the second portion 122 may fill the first trench t1 that penetrates the first semiconductor film 140, the second buried insulation layer 130, and the first portion 121. Accordingly, the first well 120 which includes the first portion 121 extending along the upper surface of the first buried insulation layer 110 and the second portion 122 for filling the first trench t1 may be formed.

The fourth portion 222 may fill the first trench t1 that penetrates the second semiconductor film 240, the second buried insulation layer 130 and the third portion 221. Accordingly, the second well 220 which includes the third portion 221 extending along the upper surface of the second buried insulation layer 130 and the fourth portion 222 for filling the first trench t1 may be formed.

The second portion 122 of the first well 120 and the fourth portion 222 of the second well 220 may be formed by doping the substrate with impurities, respectively. For example, the substrate 100 may be doped with the substance of the first conductive type and the substance of the second conductive type to form each of the second portion 122 and the fourth portion 222.

Figure 15:
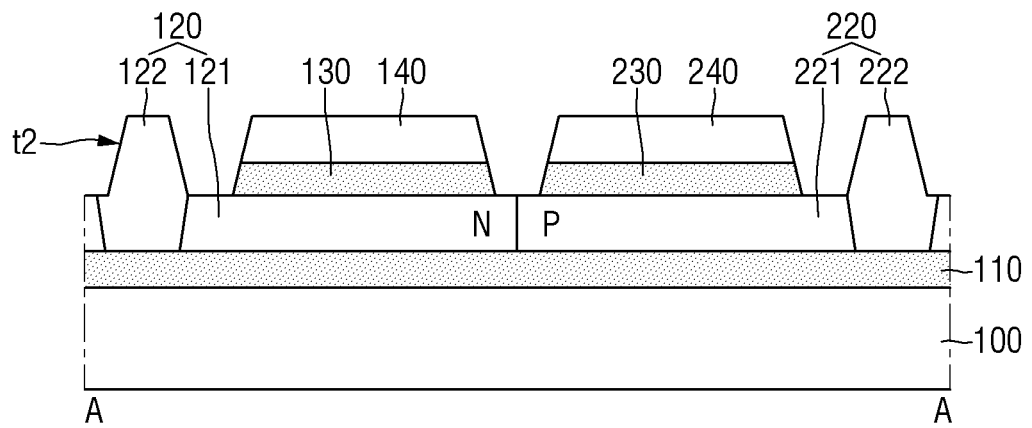
Figure 15:
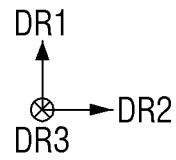

Referring to FIG. 15, a second trench t2 may be formed. The second trench t2 may be formed between the first semiconductor film 140 and the second semiconductor film 240. Further, the second trench t2 may be formed, for example, on both sides of the second portion 122 and both sides of the fourth portion 222.

The second trench t2 may be formed by etching up to the second buried insulation layer 130 and the third buried insulation layer 230. The second trench t2 may expose the upper surface of the first portion 121 of the first well 120 and the upper surface of the third portion 221 of the second well 220. Accordingly, the second buried insulation layer 130 and the third buried insulation layer 230 may be separated, and the first semiconductor film 140 and the second semiconductor film 240 may be separated. Further, the first semiconductor film 140 and the second buried insulation layer 130 may be separated from the second portion 122 of the first well 120, and the second semiconductor film 240 and the third buried insulation layer 230 may be separated from the fourth portion 222 of the second well 220.

Alternatively, the second trench t2 may be formed such that a bottom surface is placed on the upper surface of the second buried insulation layer 130 and the upper surface of the third buried insulation layer 230. Alternatively, the second trench t2 may be formed such that the bottom surface is placed inside the second buried insulation layer 130 and the third buried insulation layer 230.

Figure 16:
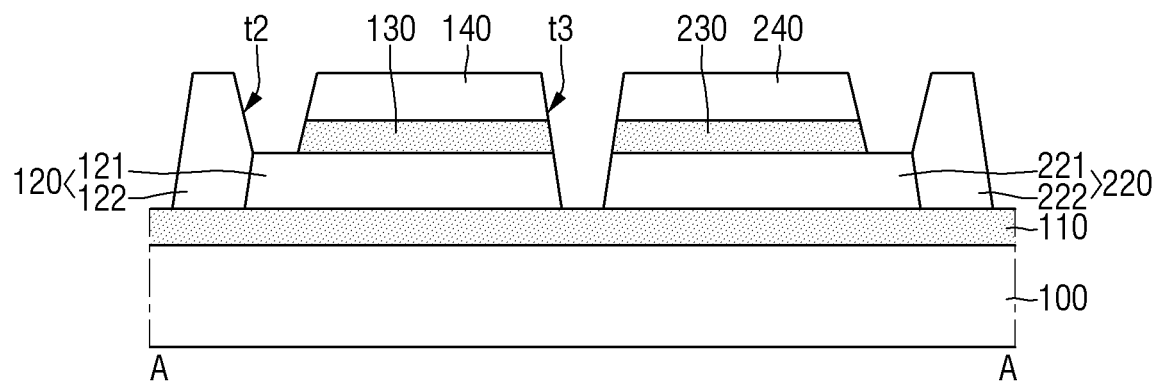
Figure 16:
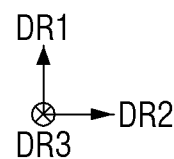

Referring to FIG. 16, a third trench t3 may be formed by further etching the first portion 121 of the first well 120 and the fourth portion 222 of the second well 220 on a part of the second trench t2. The third trench t3 may expose the upper surface of the first buried insulation layer 110. Accordingly, the first portion 121 of the first well 120 may be separated from the third portion 221 of the second well 220, and the second portion 122 of the first well 120 and the fourth portion 222 of the second well 220 may be defined.

Alternatively, the third trench t3 may be formed such that the bottom surface is placed inside the first buried insulation layer 110. Alternatively, the third trench t3 may expose the upper surface of the substrate 100 by etching the first buried insulation layer 110, and the bottom surface may be placed inside the substrate 100 by etching a part of the substrate 100.

Figure 17:
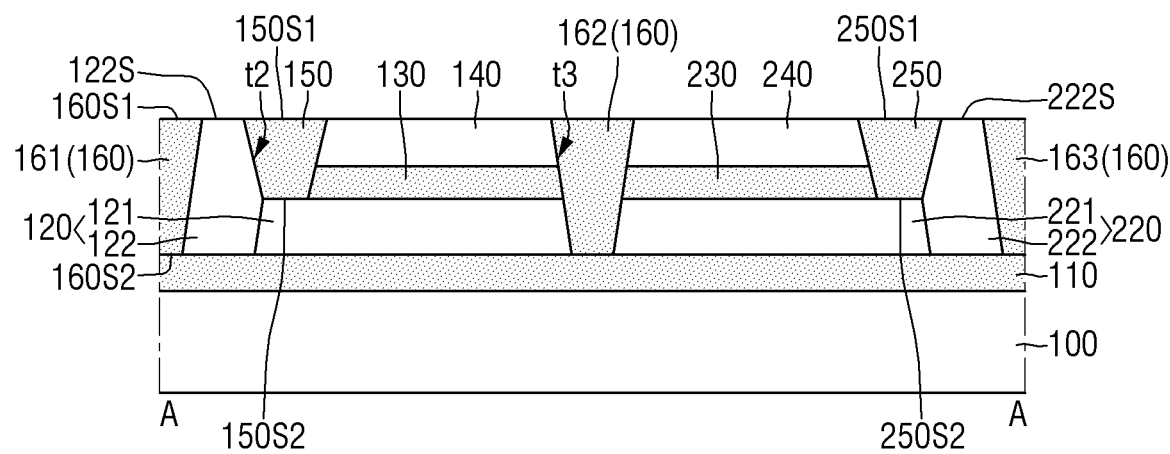
Figure 17:
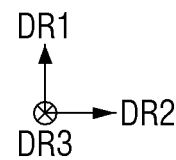

Referring to FIG. 17, the first element separation film 160 may fill the third trench t3. The second element separation film 150 may fill the second trench t2 on the first well 120. The third element separation film 250 may fill the second trench t2 on the second well 220. Accordingly, the upper surface 160S1 of the first element separation film 160, the upper surface 150S1 of the third element separation film 250, and the upper surface 250S1 of the third element separation film 250 may be placed substantially on the same plane as the upper surface 122S of the second portion 122 of the first well 120 and the upper surface 222S of the fourth portion 222 of the second well 220.

Further, the lower surface 160S2 of the first element separation film 160 may be placed below the lower surface 150S2 of the second element separation film 150 and the lower surface 250S2 of the third element separation film 250. This may be due to the formation of the second trench t2 and the third trench t3.

Referring to FIG. 2, the first source region 141 and the first drain region 142 may be formed inside the first semiconductor film 140, and the second source region 241 and the second drain region 242 may be formed inside the second semiconductor film 240. The first source region 141, the first drain region 142, the second source region 241 and the second drain region 242 may be formed by doping each of the first semiconductor film 140 and the second semiconductor film 240 with impurities or by an epitaxial growth.

The first gate structure 180 may be formed on the first semiconductor film 140, and the second gate structure 280 may be formed on the second semiconductor film 240. By forming an insulation layer and a conductive film on the first semiconductor film 140 and the second semiconductor film 240, and patterning them, the first and second gate insulation layers 182 and 282 and the first and second gate electrodes 181 and 281 may be formed. The first and second gate spacers 183 and 183 may be formed on the side walls of the first and second gate electrodes 181 and 281. Although the first and second gate structures 180 and 280 have been described as being formed by the gate first method, the disclosure is not limited thereto, and the first and second gate structures 180 and 280 may also be formed by the gate last method.

The interlayer insulation layer 170 may be formed, and the interlayer insulation layer 170 may be etched to form a contact hole. The contact hole may be filled with conductive substance to form contacts 191, 193, 195, 197, 293, 295 and 297.

FIGS. 18 to 21 are intermediate stage diagrams for explaining a method of manufacturing a semiconductor device in reference to FIGS. 1, 2 and 12-17, according to some embodiments. For reference, FIGS. 18 to 23 are cross-sectional views taken along A-A of FIG. 1. The reference numbers used in FIGS. 1, 2 and 12-17 apply to the description of the method shown in FIGS. 18 to 21.

Figure 18:
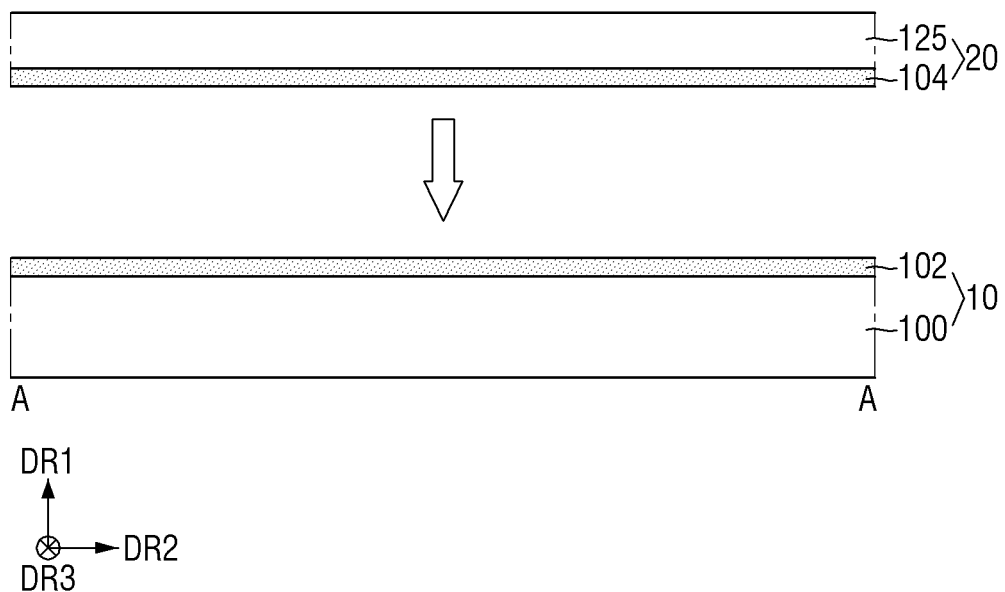
FIGS. 18 to 21 are intermediate stage diagrams for explaining a method of manufacturing a semiconductor device in reference to FIGS. 1, 2 and 12-17, according to some embodiments.

Referring to FIG. 18, a first substrate 10 and a second substrate 20 may be provided. The first substrate 10 may include the substrate 100, and a first insulation layer 102 placed on the substrate 100. The second substrate 20 may include a first additional substrate 125, and a second insulation layer 104 placed on the first additional substrate 125. The first substrate 10 and the second substrate 20 may be an SOI (Silicon on Insulator) substrate in which an insulation layer is formed on a silicon substrate.

The second substrate 20 may be attached onto the first substrate 10 such that the second insulation layer 104 faces the first insulation layer 102.

Figure 19:
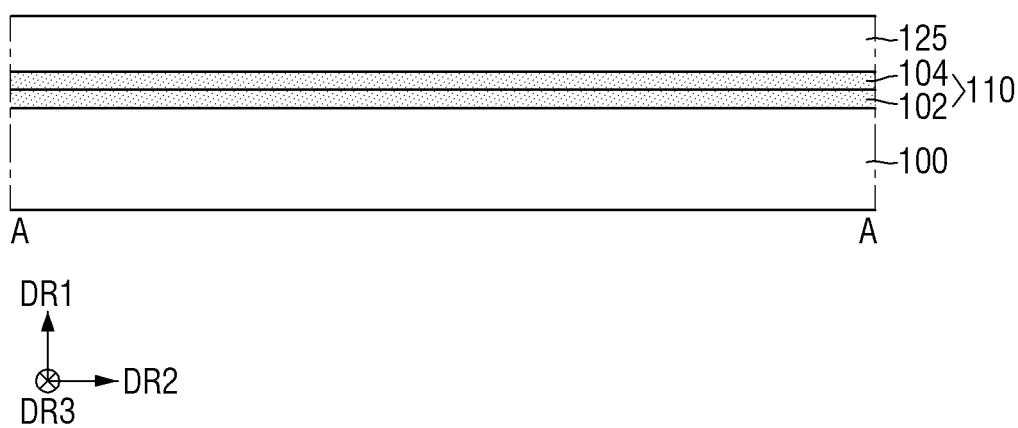

Referring to FIG. 19, the first insulation layer 102 and the second insulation layer 104 may be attached to form the first buried insulation layer 110. The substrate 100 and the first additional substrate 125 may be spaced apart from each other by the first buried insulation layer 110.

Figure 20:
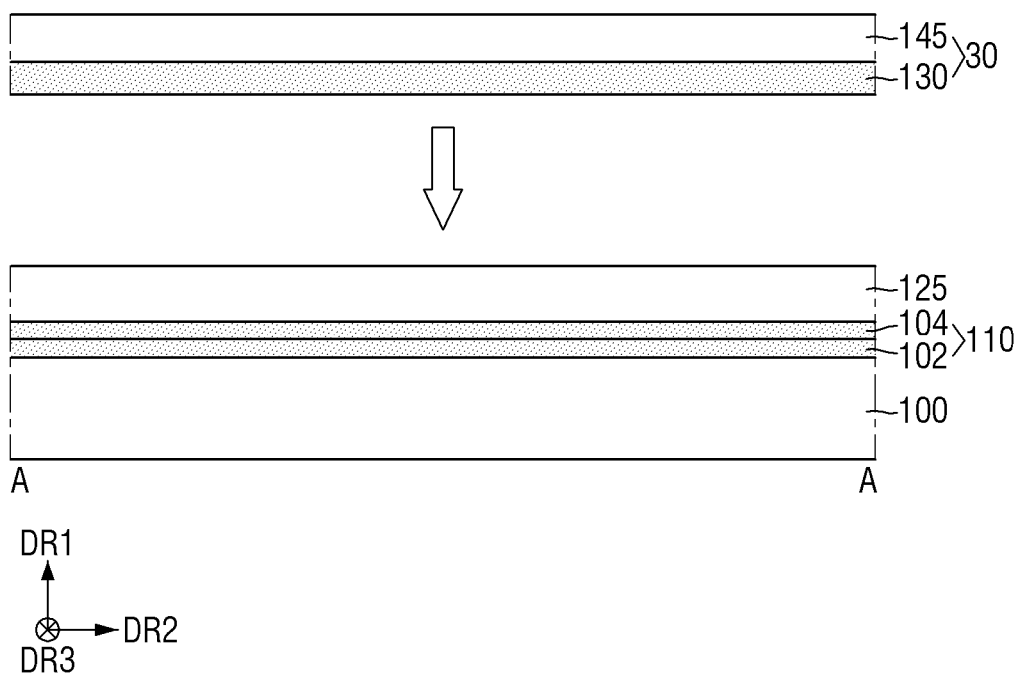

Referring to FIG. 20, a third substrate 30 may be provided. The third substrate 30 may include a second additional substrate 145, and the second buried insulation layer 130 placed on the second additional substrate 145. The third substrate 30 may be an SOI (Silicon on Insulator) substrate in which an insulation layer is formed on a silicon substrate.

The third substrate 30 may be attached onto the first additional substrate 125 such that the second buried insulation layer 130 faces the first additional substrate 125.

Figure 21:
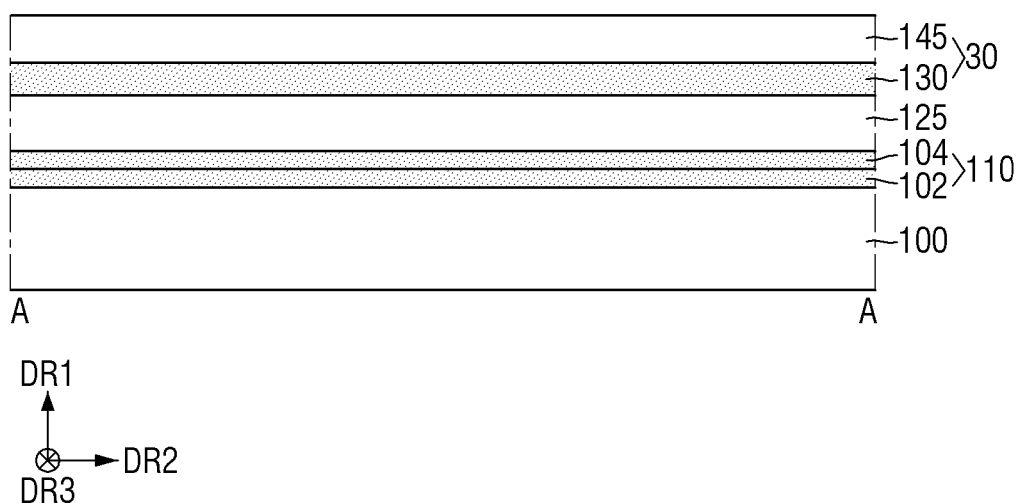

Referring to FIG. 21, the first additional substrate 125 and the second buried insulation layer 130 may be attached. The first additional substrate 125 and the second additional substrate 145 may be spaced apart from each other by the second buried insulation layer 130. Therefore, the substrate 100 may include two buried insulation layers 110 and 130.

Referring back to FIG. 12, the first additional substrate 125 may be doped with impurities to form the first well 120 and the second well 220, and the second additional substrate 145 may be doped with impurities form the first semiconductor film 140 and the second semiconductor film 240.

Figure 22:
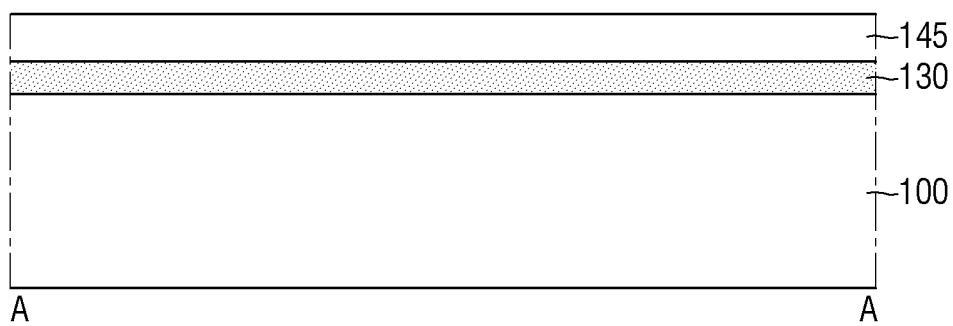
FIGS. 22 and 23 are intermediate stage diagrams for explaining a method of manufacturing a semiconductor device in reference to FIGS. 1, 2 and 12-21, according to some embodiments.
Figure 23:
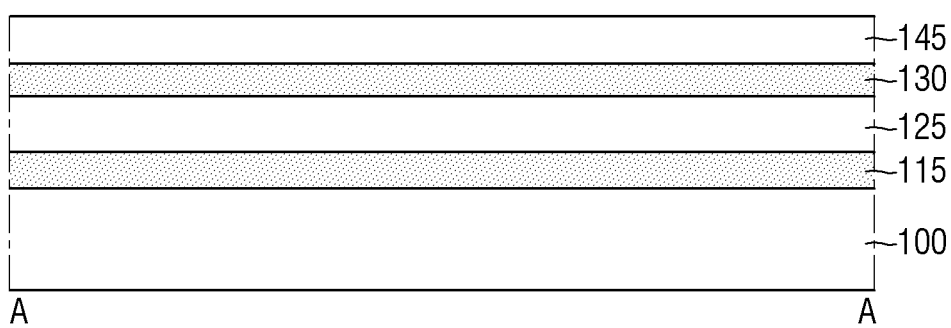

FIGS. 22 and 23 are intermediate stage diagrams for explaining a method of manufacturing a semiconductor device in reference to FIGS. 1, 2 and 12-21, according to some embodiments. For reference, FIGS. 22 and 23 are cross-sectional views taken along A-A of FIG. 1. The reference numbers used in FIGS. 1, 2 and 12-21 apply to the description of the method shown in FIGS. 22 and 23.

Referring to FIG. 22, the substrate 100 spaced apart from the second additional substrate 145 by the second buried insulation layer 130 may be provided. The substrate 100 may be an SOI substrate in which an insulation layer is formed on a silicon substrate.

An oxygen implant process may be performed on the second additional substrate 145.

Referring to FIG. 23, oxygen may be doped into the substrate 100 by the oxygen ion implanting process to form a pre-insulating layer 115. The first additional substrate 125 may be separated from the substrate 100 by the pre-insulating layer 115.

An annealing (heat) process may be performed on the second additional substrate 145. Although any one of low temperature soak annealing, flash lamp annealing, laser annealing and spike annealing may be used as the annealing process, the disclosure is not limited thereto.

Referring back to FIG. 12, oxygen in the pre-insulating layer 115 is diffused by the annealing process, and the first buried insulation layer 110 may be formed. The first additional substrate 125 may be doped with impurities to form the first well 120 and the second well 220, and the second additional substrate 145 may be doped with impurities to form the first semiconductor film 140 and the second semiconductor film 240.

FIGS. 24 to 28 are intermediate stage diagrams for explaining the method of manufacturing the semiconductor device in reference to FIGS. 10 and 11, according to some embodiments. For reference, FIGS. 24 to 28 are cross-sectional views taken along B-B of FIG. 10. The reference numbers used in FIGS. 10 and 11 apply to the description of the method shown in FIGS. 24 to 28.

Figure 24:
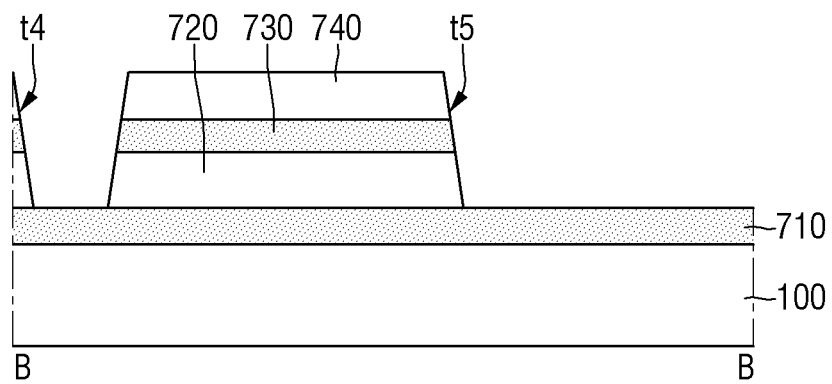
FIGS. 24 to 28 are intermediate stage diagrams for explaining the method of manufacturing the semiconductor device in reference to FIGS. 10 and 11, according to some embodiments.
Figure 24:
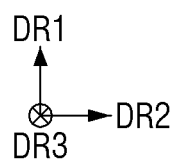

Referring to FIG. 24, the substrate 100 on which the first buried insulation layer 710, the first well 720, the third buried insulation layer 730 and the first semiconductor film 740 are sequentially formed may be provided. The first well 720 may be the first portion 721 of the first well 720 to be described below.

A fourth trench t4 and a fifth trench t5 may be formed. The fourth trench t4 and the fifth trench t5 may penetrate the first semiconductor film 740, the third buried insulation layer 730, and the first well 720. The upper surface of the first buried insulation layer 710 may be exposed by the fourth trench t4 and the fifth trench t5.

Alternatively, the fourth trench t4 and/or the fifth trench t5 may etch the first semiconductor film 740 and the third buried insulation layer 730 to expose the top surface of the first well 720. Alternatively, the fourth trench t4 and/or the fifth trench t5 may be formed such that the bottom surfaces are placed inside the first well 720.

For example, the width of the fourth trench t4 in the second direction DR2 may be smaller than the width of the fifth trench t5. The region in which the fifth trench t5 is formed may be a region for forming a second transistor to be described below.

The first well 720 and the first semiconductor film 740 may be formed by doping the substrate 100 with impurities, respectively.

Figure 25:
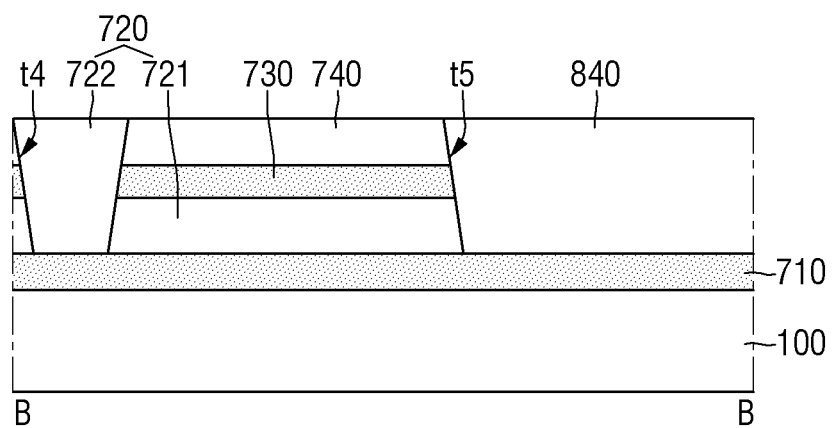
Figure 25:
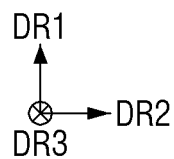

Referring to FIG. 25, the second portion 722 may fill the fourth trench t4. Accordingly, the first well 720 which includes the first portion 721 extending along the first buried insulation layer 710 and the second portion 722 for filling the fourth trench t4 may be formed.

The first semiconductor film 740 may fill the fifth trench t5. The first semiconductor film 740 may be formed by doping the substrate 100 with impurities.

Figure 26:
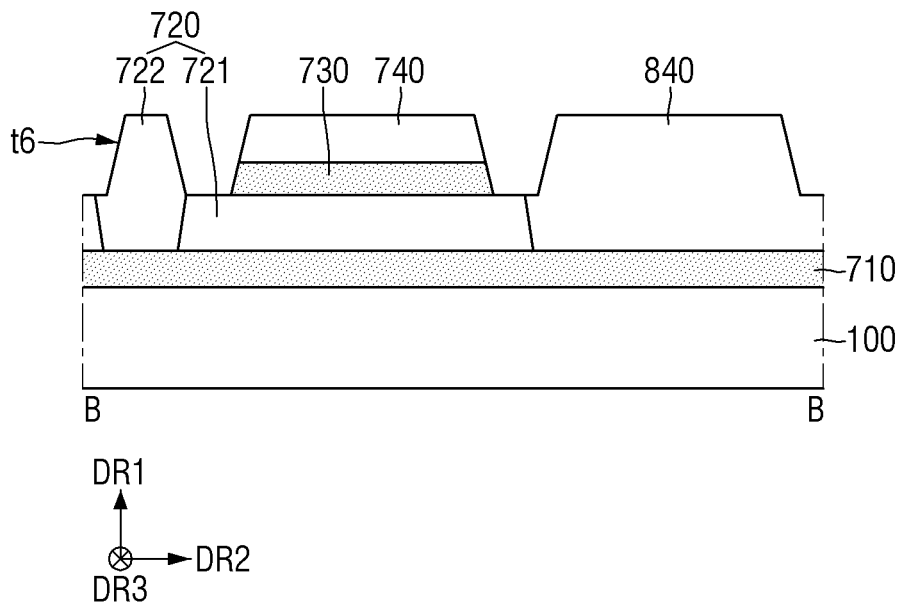

Referring to FIG. 26, a sixth trench t6 may be formed. The sixth trench t6 may be formed between the first semiconductor film 740, the third buried insulation layer 730 and the second semiconductor film 840. Further, the sixth trench t6 may be formed, for example, on both sides of the second portion 722 of the first well 720.

The sixth trench t6 may be formed by etching up to the third buried insulation layer 730. The sixth trench t6 may expose the upper surface of the first portion 721 of the first well 720. Accordingly, the third buried insulation layer 730 and the first semiconductor film 740 may be separated from the second semiconductor film 840. Further, the first semiconductor film 740 and the third buried insulation layer 730 may be separated from the second portion 722 of the first well 720.

Alternatively, the sixth trench t6 may be formed such that the bottom surface is placed on the upper surface of the third buried insulation layer 730. Alternatively, the sixth trench t6 may be formed such that the bottom surface is placed inside the third buried insulation layer 730.

Figure 27:
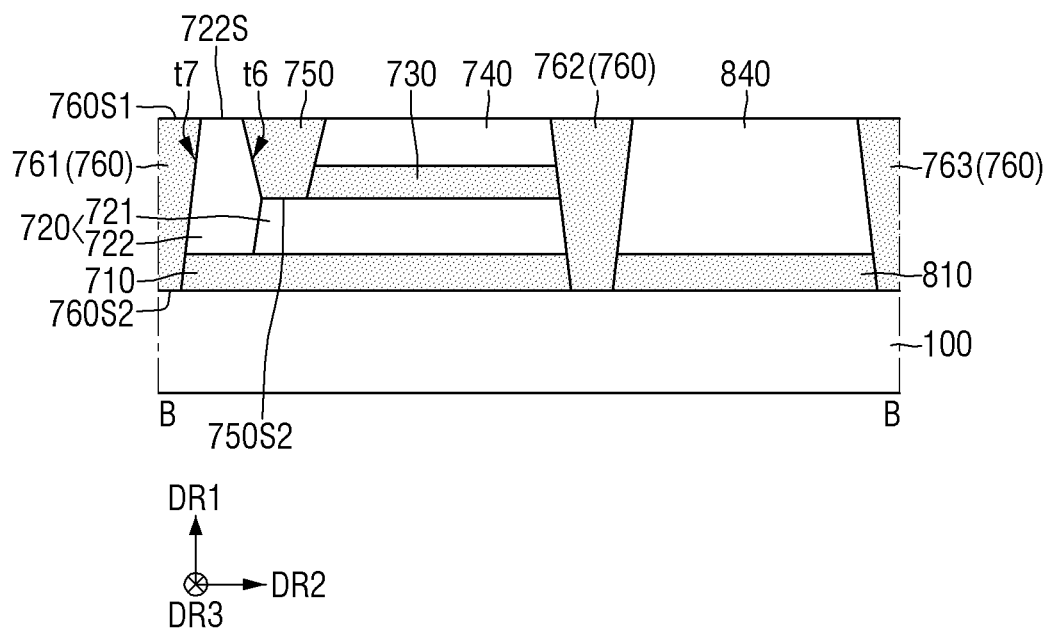

Referring to FIG. 27, a seventh trench t7 may be formed by further etching the first portion 721 of the first well 720 on a part of the sixth trench t6. The seventh trench t7 may expose the upper surface of the substrate 100. Accordingly, the first portion 721 of the first well 720 may be separated from the second semiconductor film 840, and the first buried insulation layer 710 may be separated from the second buried insulation layer 810. A second portion 722 of the first well 720 may be defined.

Alternatively, the seventh trench t7 may be formed such that the bottom surface is placed on the upper surface of the first buried insulation layer 710, and the first buried insulation layer 710 and the second buried insulation layer 810 may not be separated. Alternatively, the seventh trench t7 may be formed such that the bottom surface is placed inside the first buried insulation layer 710 and the second buried insulation layer 810.

Figure 28:
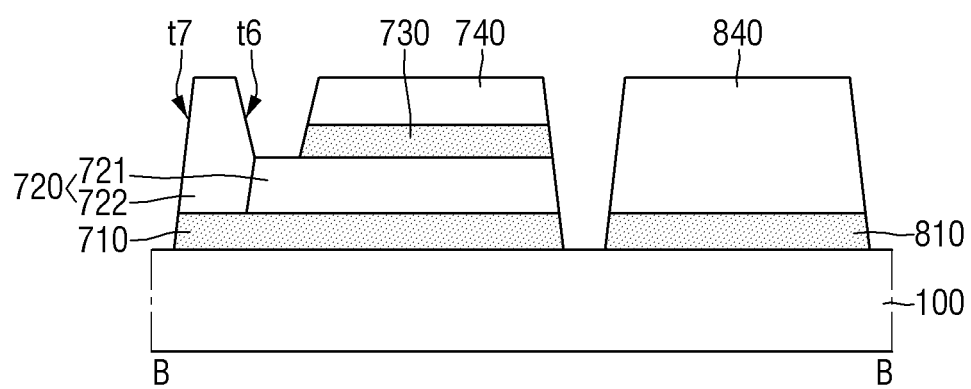
Figure 28:
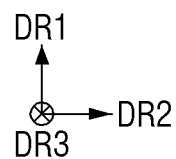

Referring to FIG. 28 along with FIG. 11, the first element separation film 760 may fill the seventh trench t7. The second element separation film 750 may fill the sixth trench t6. Accordingly, the upper surface 760S1 of the first element separation film 760 and the upper surface 750S1 of the second element separation film 750 may be placed substantially on the same plane as an upper surface 722S of the second portion 722 of the first well 720.

Further, the lower surface 760S2 of the first element separation film 760 may be placed below a level of the lower surface 750S2 of the second element separation film 750. This may be due to the formation of the sixth trench t6 and the seventh trench t7.

Referring back to FIG. 11, the first source region 741 and the first drain region 742 may be formed inside the first semiconductor film 740, and the second source region 841 and the second drain region 842 may be formed inside the second semiconductor film 840. The first source region 741, the first drain region 742, the second source region 841 and the second drain region 842 may be formed by doping each of the first semiconductor film 740 and the second semiconductor film 840 with impurities or by an epitaxial growth.

The first gate structure 780 may be formed on the first semiconductor film 740, and the second gate structure 880 may be formed on the second semiconductor film 840. By forming an insulation layer and a conductive film on the first semiconductor film 740 and the second semiconductor film 840, and patterning them, the first and second gate insulation layers 782 and 882, and the first and second gate electrodes 781 and 881 may be formed. The first and second gate spacers 783 and 883 may be formed on the side walls of the first and second gate electrodes 781 and 881. Although the first and second gate structures 780 and 880 have been described as being formed by the gate first method, the disclosure is not limited thereto, and the first and second gate structures 780 and 880 may also be formed by the gate last method.

The interlayer insulation layer 770 is formed, and the interlayer insulation layer 770 is etched to form a contact hole. Contact holes may be filled with conductive substance to form contacts 791, 793, 795, 797, 893, 895 and 897.

In concluding the detailed description, those skilled in the art will appreciate that many variations and modifications may be made to the above embodiments without substantially departing from the principles of the disclosure. Therefore, the above embodiments of the disclosure are used in a generic and descriptive sense only and not for purposes of limitation.

What is claimed is:

1. A semiconductor device comprising:
a substrate;
a first buried insulation layer disposed on the substrate;
a first well which is disposed on the first buried insulation layer in a first region defined by a first element separation film, and comprises a first portion extending along an upper surface of the first buried insulation layer, and a second portion extending from the first portion in a direction from the substrate toward the first buried insulation layer;
a second buried insulation layer disposed on the first portion of the first well;

a first semiconductor film disposed on the second buried insulation layer;

a first transistor on the first semiconductor film;

a second element separation film which separates the first semiconductor film from the second portion of the first well on the first portion of the first well;

a second well which is disposed on the first buried insulation layer in a second region being adjacent to the first region and defined by the first element separation film, and comprises a third portion extending along the upper surface of the first buried insulation layer, and a fourth portion extending from the third portion in the direction;

a third buried insulation layer disposed on the third portion of the second well;

a second semiconductor film disposed on the third buried insulation layer;

a second transistor disposed on the second semiconductor film; and a third element separation film which separates the second semiconductor film from the fourth portion of the second well on the third portion of the second well, wherein the first well, the second buried insulation layer and the first semiconductor film are completely separated from the second well, the third buried insulation layer and the second semiconductor film, respectively, by the first element separation film, and wherein an upper surface of the second portion of the first well is placed on the same plane as an upper surface of the first element separation film.

2. The semiconductor device of claim 1, wherein the second portion of the first well is disposed in a space between the first element separation film and the second element separation film.

3. The semiconductor device of claim 1, wherein a lower surface of the first element separation film is disposed below a level of a lower surface of the second element separation film.

4. The semiconductor device of claim 1, wherein an upper surface of the second portion of the first well is disposed on the same plane as an upper surface of the second element separation film.

5. The semiconductor device of claim 1, further comprising:

a first well contact disposed on the upper surface of the second portion of the first well.

6. The semiconductor device of claim 1, wherein the first element separation film penetrates the first buried insulation layer and penetrates at least a part of the substrate.

7. The semiconductor device of claim 1, further comprising:

a third semiconductor film which is disposed in a third region defined by the first element separation film, on the first buried insulation layer; and a third transistor placed on the third semiconductor film.

8. The semiconductor device of claim 7, wherein the first well, the second buried insulation layer, the first semiconductor film, and the third semiconductor film are completely separated from one another by the first element separation film.

9. The semiconductor device of claim 7, wherein the first transistor comprises a first source/drain region placed inside the first semiconductor film, wherein the third transistor comprises a third source/drain region placed inside the third semiconductor film, and wherein a bottom surface of the third source/drain region is disposed below a bottom surface of the first source/drain region.

10. The semiconductor device of claim 1, wherein the second element separation film is disposed between the first semiconductor film and the second portion of the first well and is not disposed between the first semiconductor film and the first element separation film, and wherein the third element separation film is disposed between the second semiconductor film and the fourth portion of the second well and is not disposed between the second semiconductor film and the first element separation film.

* * * * *